United States Patent
Cerini et al.

(10) Patent No.: US 10,623,866 B2
(45) Date of Patent: Apr. 14, 2020

(54) PIEZOELECTRIC ACOUSTIC MEMS TRANSDUCER AND FABRICATION METHOD THEREOF

(71) Applicant: STMICROELECTRONICS S.R.L., Agrate Brianza (IT)

(72) Inventors: Fabrizio Cerini, Magenta (IT); Silvia Adorno, Novate Milanese (IT); Federico Vercesi, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/389,833

(22) Filed: Apr. 19, 2019

(65) Prior Publication Data

US 2019/0327562 A1    Oct. 24, 2019

(30) Foreign Application Priority Data

Apr. 20, 2018  (IT) .................. 102018000004758

(51) Int. Cl.
| | | |
|---|---|---|
| *H04R 17/02* | (2006.01) | |
| *B81B 3/00* | (2006.01) | |
| *B81C 1/00* | (2006.01) | |
| *H01L 41/113* | (2006.01) | |

(52) U.S. Cl.
CPC ........... *H04R 17/02* (2013.01); *B81B 3/0021* (2013.01); *B81C 1/00158* (2013.01); *H01L 41/1132* (2013.01); *B81B 2201/0257* (2013.01); *B81C 2201/0105* (2013.01); *H04R 2201/003* (2013.01)

(58) Field of Classification Search
CPC ............ H04R 2201/003; H04R 19/005; H04R 17/02; H04R 17/00; H04R 2499/11; H04R 31/003; H04R 17/005; B81B 2201/0257; B81B 2203/0109; B81B 3/0021; H01L 41/1136; H01L 2924/1461; H01L 27/20; H01L 41/1132; B81C 1/00158; B81C 2201/0105
USPC .................... 381/173, 190, 114, 175; 438/53
See application file for complete search history.

(56) References Cited

U.S. PATENT DOCUMENTS

| | | | |
|---|---|---|---|
| 8,896,184 B2 | 11/2014 | Grosh et al. | |
| 8,958,595 B2 | 2/2015 | Hwang et al. | |
| 9,386,379 B2 | 7/2016 | Sparks et al. | |
| 10,034,097 B2 | 7/2018 | Clerici et al. | |
| 2017/0325030 A1* | 11/2017 | Stoppel | H04R 17/00 |
| 2018/0234783 A1 | 8/2018 | Clerici et al. | |
| 2019/0082268 A1* | 3/2019 | Yoo | H04R 17/02 |

FOREIGN PATENT DOCUMENTS

WO    2019/081220 A1    5/2019

* cited by examiner

*Primary Examiner* — Norman Yu
(74) *Attorney, Agent, or Firm* — Seed Intellectual Property Law Group LLP

(57) ABSTRACT

A piezoelectric MEMS transducer formed in a body of semiconductor material, which has a central axis and a peripheral area and comprises a plurality of beams, transverse to the central axis and having a first end, coupled to the peripheral area of the body, and a second end, facing the central axis; a membrane, transverse to the central axis and arranged underneath the plurality of beams; and a pillar, parallel to the central axis and rigid with the second end of the beams and to the membrane. The MEMS transducer further comprises a plurality of piezoelectric sensing elements arranged on the plurality of beams.

25 Claims, 22 Drawing Sheets

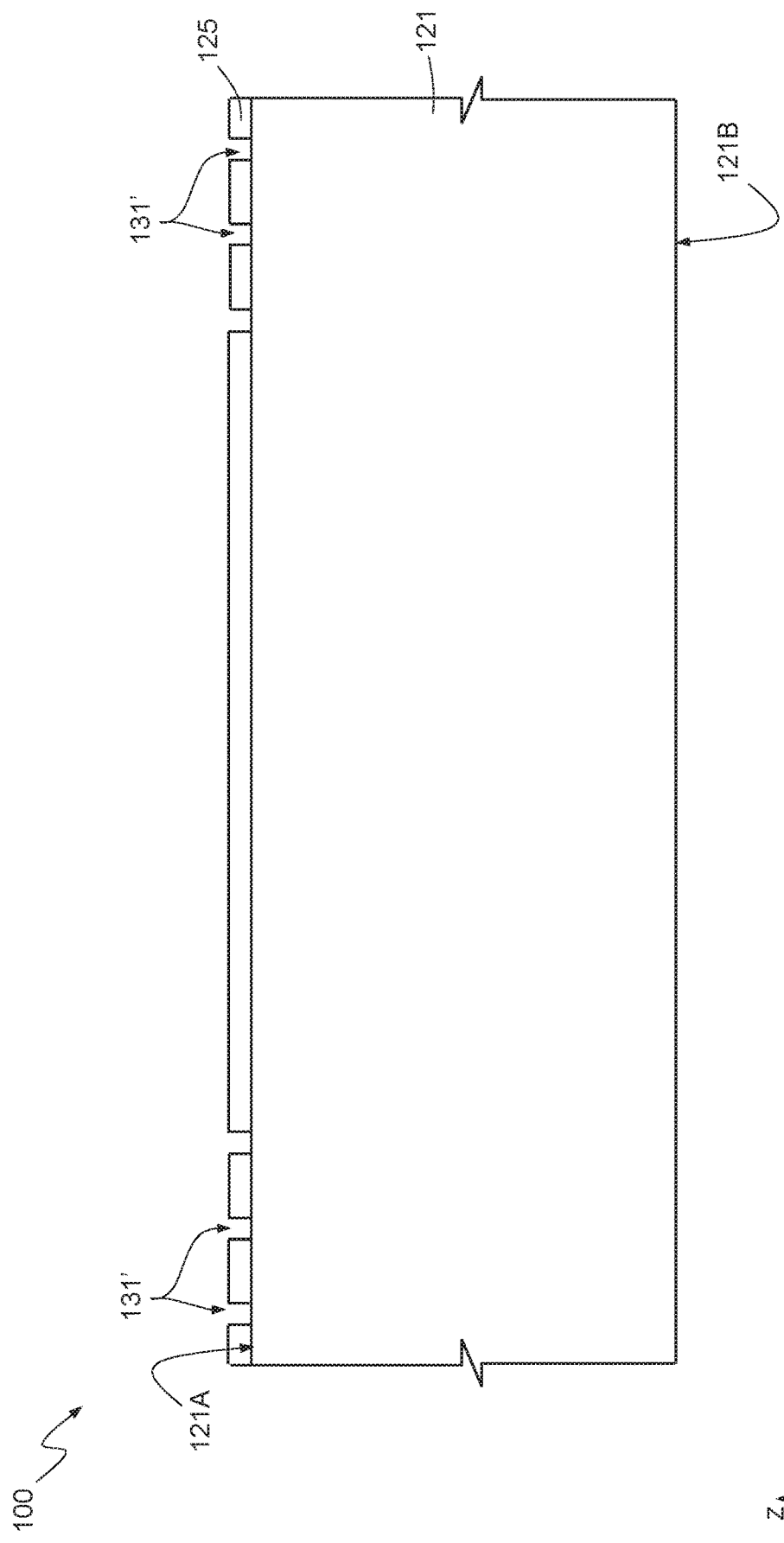

PIEZOELECTRIC ACOUSTIC MEMS TRANSDUCER AND FABRICATION METHOD THEREOF

BACKGROUND

Technical Field

The present disclosure relates to a piezoelectric acoustic MEMS (Micro-Electro-Mechanical Systems) transducer and to the fabrication method thereof.

Description of the Related Art

As is known, MEMS techniques of micromachining of semiconductor devices allow forming MEMS structures within semiconductor layers, deposited (for example, a polycrystalline silicon layer) or grown (for example, an epitaxial layer) on sacrificial layers that are at least in part removed through etching.

For instance, electroacoustic MEMS transducers (microphones) comprise a flexible membrane integrated in or on a semiconductor material die, as illustrated in FIG. 1. Here, the microphone 1 comprises a membrane 2 carried by a substrate 3 and suspended over a cavity 4. The membrane 2 is exposed to sound waves (i.e., formed by perturbations superimposed on the atmospheric pressure $p_{atm}$) and bends as a result of the force exerted thereby, as illustrated by the dashed lines.

Membrane bending measurement may be of different types. For instance, bending detection may be of a piezoresistive or piezoelectric type, by integrating piezoresistive or piezoelectric elements in or on the membrane; of a capacitive type, wherein the membrane is capacitively coupled to another conductive region of the die; and of an electromagnetic type, wherein, for example, a coil is coupled to a magnetic region. In all cases, the variation of an electrical signal resulting from membrane deflection is measured.

In particular, capacitive microphones are currently widely used in various types of mobile devices, such as smartphones, PCs, tablets, and the like.

However, microphones of this type are disadvantageous. In fact, capacitive microphones may present reliability problems due to contamination by external particles and/or other contaminants (for example, water, dust, soldering vapors, etc.). In particular, the external particles may be trapped between the electrodes of the capacitor, acting as mechanical blocks for the membrane deflection and generating electrical leakage paths, thus causing malfunctioning and a reduction in performance of the microphone. In addition, the presence of contaminants between the electrodes of the capacitor may cause permanent damage to the microphone. Consequently, it is not possible to use a capacitive MEMS microphone in an environment such as water.

To overcome the above limitations, microphones of a piezoelectric type have recently been proposed, exploiting piezoelectricity, i.e., the capacity of some materials to generate a voltage when subjected to a deformation. In particular, piezoelectric microphones are able to operate even when they are immersed in fluids other than air (for example, water and non-conductive liquids) and are not affected by malfunctioning and/or reduction in performance due to contaminants and external particles as MEMS capacitive microphones.

In particular, in piezoelectric microphones, sensitive regions of piezoelectric material, such as aluminum nitride (AlN) and PZT (lead zirconate titanate) are formed on the membrane, in proximity of areas with a maximum stress. In presence of sound waves that cause deflection of the membrane, the sensitive regions, which deflect together with the membrane, give rise to a voltage variation correlated to the intensity of the detected sound wave. An interface circuit connected to the MEMS microphone amplifies and processes the electrical signal generated by the latter and outputs an analog or digital signal that can then be processed by a microcontroller of an associated electronic device.

An example of piezoelectric MEMS microphone is described in U.S. Pat. No. 8,896,184 and is illustrated in FIG. 2.

In detail, FIG. 2 shows a MEMS microphone 5 of a cantilever type. The microphone 5 comprises a silicon substrate 6 having a cavity 7 with two beams 8A, 8B extending thereover. Each beam 8A, 8B is anchored to the substrate 6 at a respective end. In addition, the beams 8A, 8B define between them a ventilation opening 9. Moreover, each beam 8A, 8B is formed by a stack of layers, formed, for example, by a plurality of piezoelectric layers 11 (for instance, of AlN), alternating with a plurality of electrode layers 10 (for instance, of molybdenum, Mo). A dielectric layer 12 electrically insulates the beams 8A, 8B from the substrate 6.

However, the above known solution has some disadvantages.

In fact, the size of the ventilation hole 9 of the MEMS microphone 5 depends upon the gradient of stress on the stack of layers (and, in particular, in the piezoelectric material layer or layers) of each beam 8A, 8B, for example due to the residual stress, which, even at rest, causes an undesirable deflection of the beams, thus varying the size of the ventilation hole 9. The size variation of the ventilation hole 9 entails a less precise control of the position of the roll-off-frequency point (which determines the low-frequency behavior of the MEMS microphone 5). This is undesirable, since the position of the roll-off-frequency point can vary up to ±50 Hz, being incompatible with current market requirements where, in many cases, it is desired to have a maximum variation of roll-off frequency of ±10 Hz.

Furthermore, the MEMS microphones of a piezoelectric type currently on the market have a low sensitivity and, thus, a low SNR (Signal-to-Noise Ratio, in particular due to the noise intrinsic in the MEMS microphone and caused by the material and by the viscous resistances generated by the movement of the air of the microphone).

BRIEF SUMMARY

At least one embodiment of the present disclosure provides a MEMS transducer of a piezoelectric type that overcomes drawbacks of the prior art.

According to the present disclosure, a MEMS transducer and a fabrication method thereof are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 5-9 are cross-sections of the transducer of FIG. 3 in successive steps of the fabrication process;

DETAILED DESCRIPTION

Figure 1:
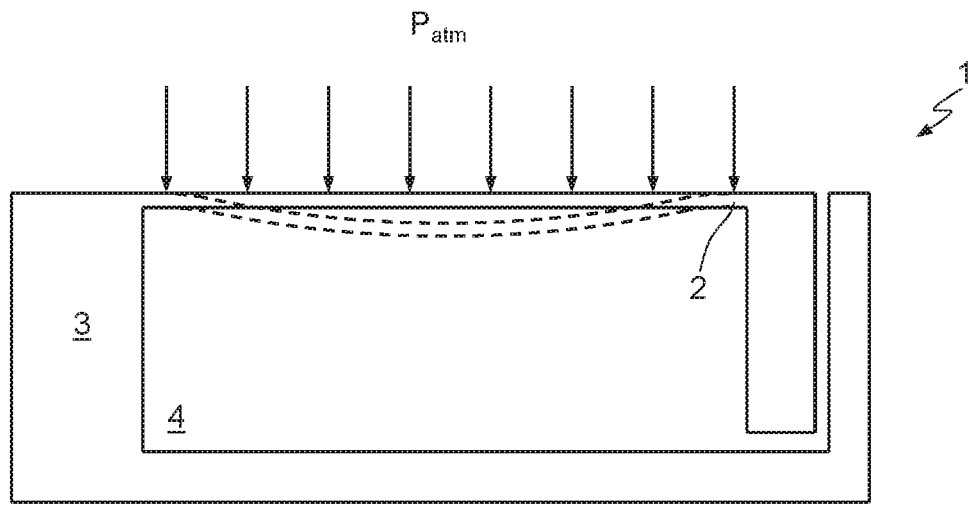
FIG. 1 is a schematic illustration of a known force sensor of a piezoelectric type.
Figure 2:
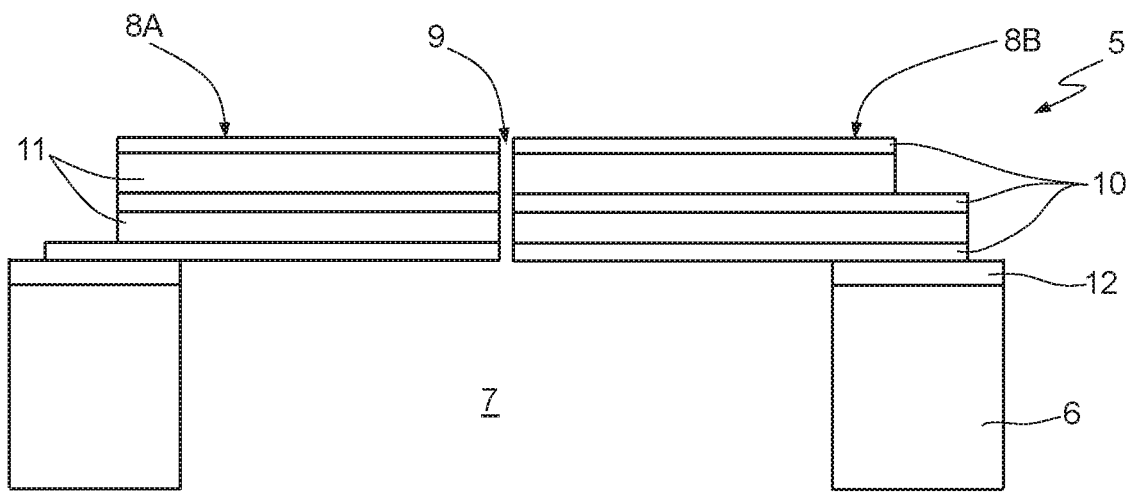
FIG. 2 is a cross-section of a known MEMS microphone of a piezoelectric type.
Figure 3:
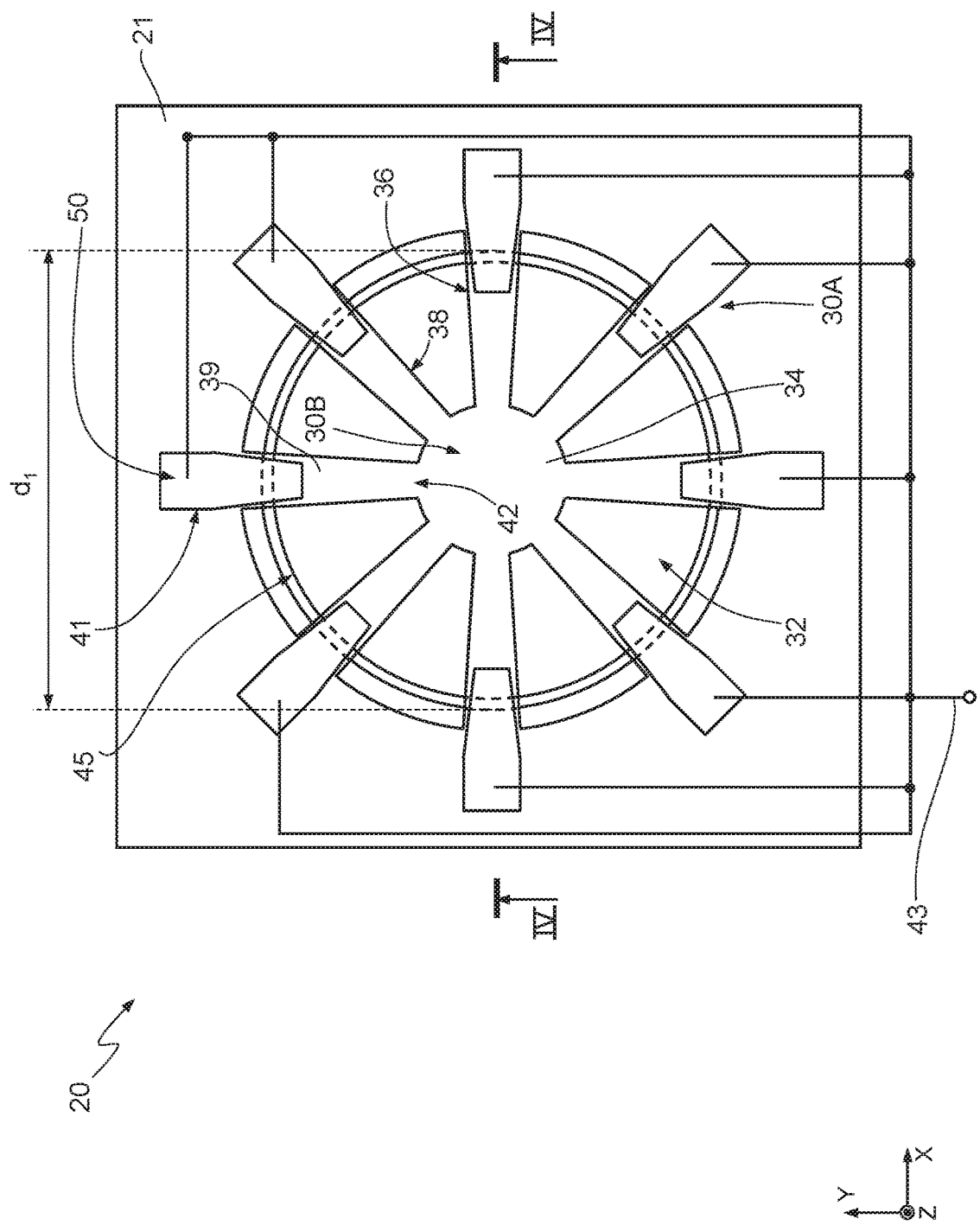
FIG. 3 is a top plan view, with parts removed, of the present transducer, according to an embodiment.
Figure 3A:
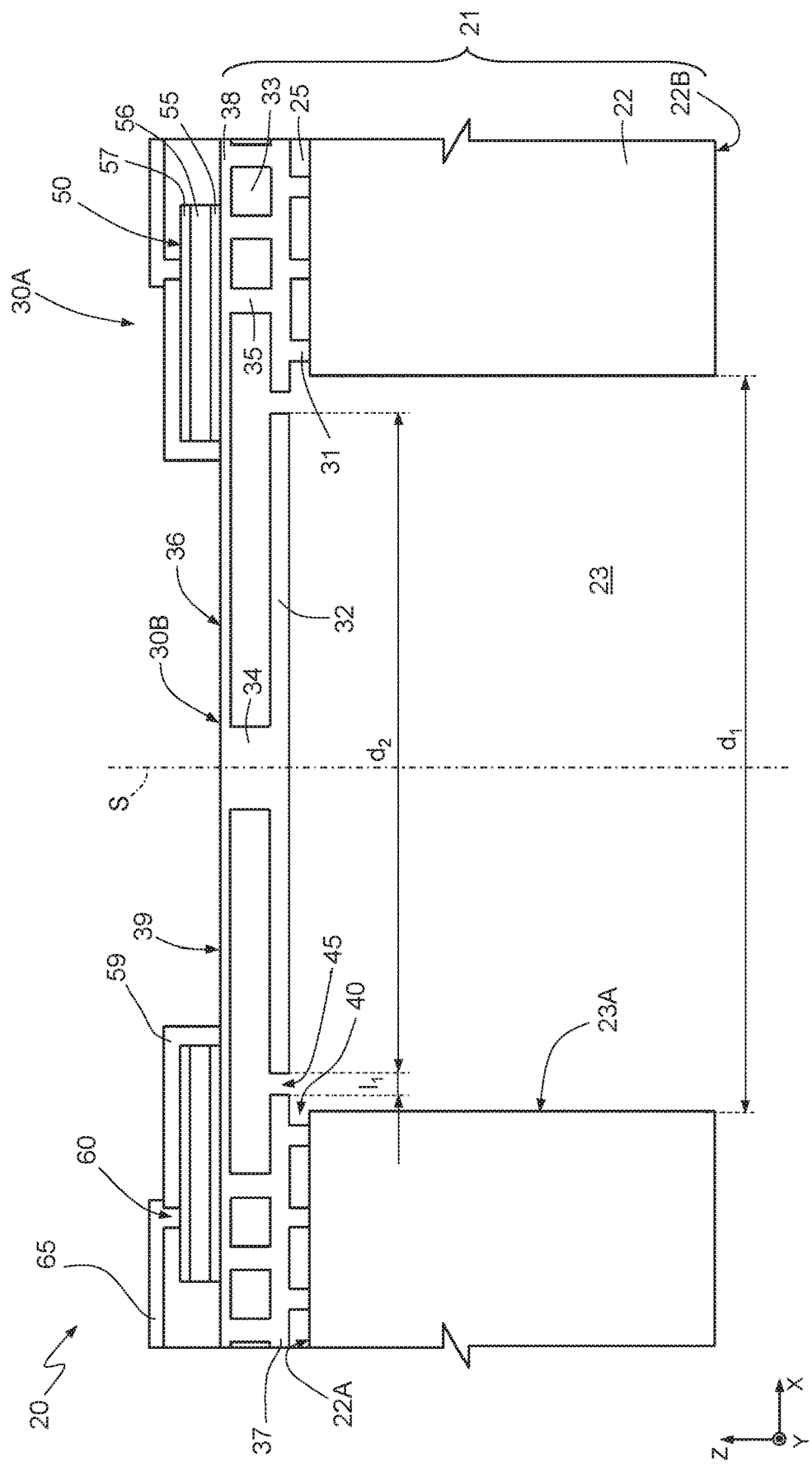
FIG. 3A is a cross-section taken along section line IV-IV of the transducer of FIG. 3.

FIGS. 3 and 3A show an embodiment of an acoustic MEMS transducer, here forming a MEMS microphone 20. In particular, the MEMS microphone 20 is of a piezoelectric type. In addition, the present MEMS transducer may form an acoustic emitting element (for example, a speaker).

With reference to FIG. 3A, the MEMS microphone 20 is formed in a body 21 comprising a substrate 22 and a sensitive region 36. The substrate 22 is of semiconductor material (for example, silicon), having a first surface 22A and a second surface 22B. In particular, the substrate 22 has, in top plan view (FIG. 3) a quadrangular, for example rectangular, shape having a central axis S.

The substrate 22 is traversed, from the second surface 22B, by a through cavity 23 having, for example, in top plan view, a circular shape with diameter $d_1$, laterally delimited by a wall 23A.

A first dielectric layer 25 extends on the first surface 22A and is, for example, of USG (Undoped Silicate Glass), thermal silicon oxide ($SiO_2$) or TEOS (TetraEthyl Ortho-Silicate).

The sensitive region 36 extends on the first dielectric layer 25 and comprises a frame portion 30A extending peripherally, and a mobile portion 30B, carried and surrounded by the frame portion 30A. The frame portion 30A surrounds and supports the mobile portion 30B, anchoring it to the substrate 22.

In particular, the mobile portion 30B is formed by a membrane 32 suspended over the through cavity 23; a pillar 34 monolithic with the membrane 32; and a plurality of beams 39 rigid with the frame portion 30A and connected to the membrane 32 by the pillar 34, monolithically with the latter. The membrane 32, the pillar 34, and the beams 39 are of semiconductor material, for example polysilicon.

With reference to FIG. 3, the membrane 32 has, for example, circular shape with diameter $d_2$; in particular, as illustrated in FIG. 3A, the membrane 32 is concentric and internal to the through cavity 23, and its diameter $d_2$ is smaller than diameter $d_1$ of the through cavity 23.

In the embodiment of FIGS. 3 and 3A, the membrane 32 is laterally delimited by a ventilation opening 45, for example, of annular shape in top plan view (FIG. 3). In greater detail, in top plan view, the ventilation opening 45 surrounds the pillar 34 at a distance; moreover, it is in fluidic communication with the through cavity 23. The ventilation opening 45 has a width (i.e., a distance between its inner edge and its outer edge) $l_1$.

The frame portion 30A of the sensitive region 36 comprises a first structural layer 37, overlying the first dielectric layer 25; a second dielectric layer 33, overlying the structural layer 37; a second structural layer 38, overlying the second dielectric layer 33; and a plurality of first anchorage elements 31 and second anchorage elements 35.

In detail, the first structural layer 37 is, for example, of polysilicon and has the same thickness and characteristics as the membrane 32, being formed simultaneously therewith, as described hereinafter with reference to FIGS. 5 and 6.

The second dielectric layer 33 is, for example made of USG, silicon oxide, or TEOS and defines the distance between the membrane 32 and the plurality of beams 39 and, thus, the height (measured along axis Z of reference system XYZ) of the pillar 34.

Figure 7:
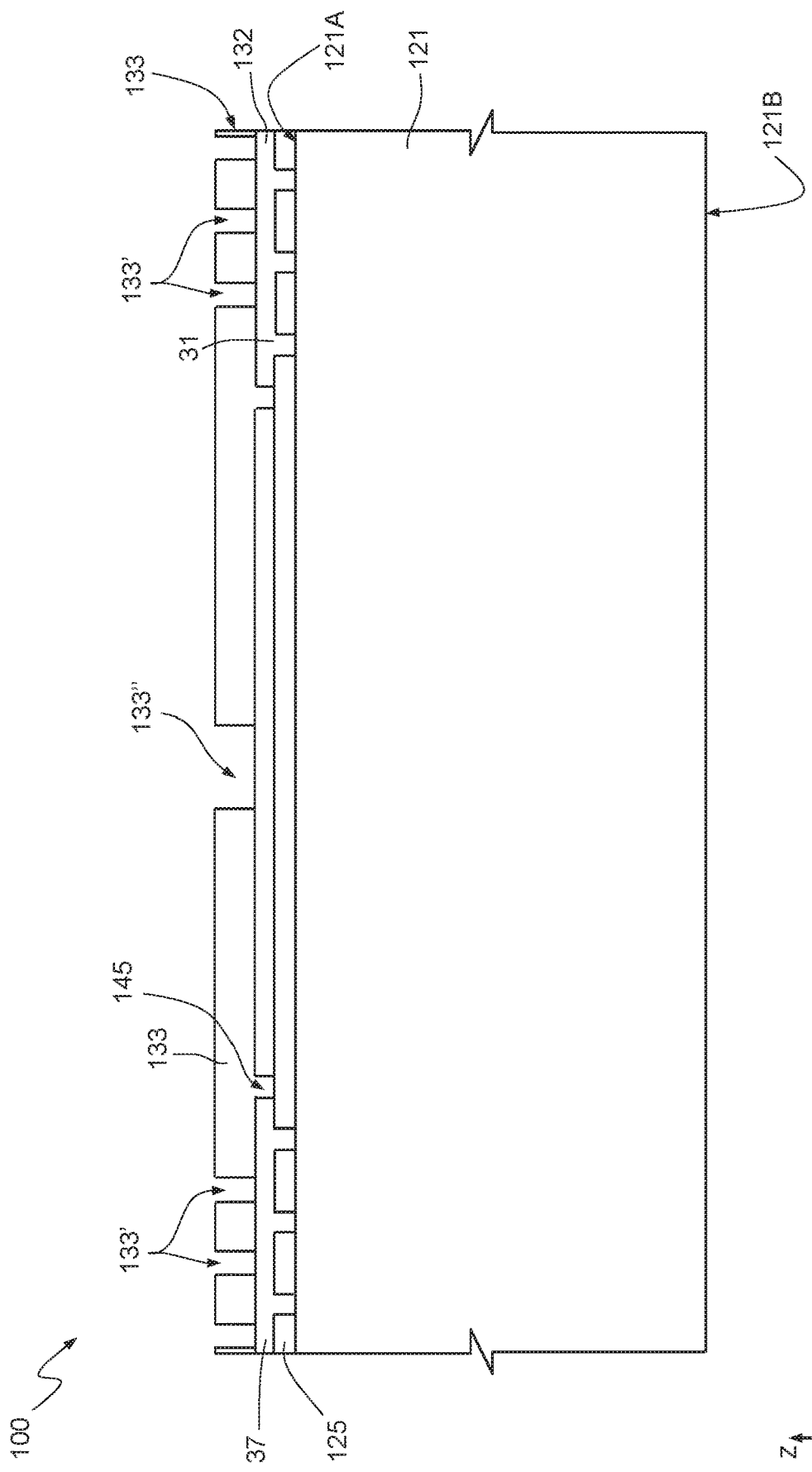
Figure 8:
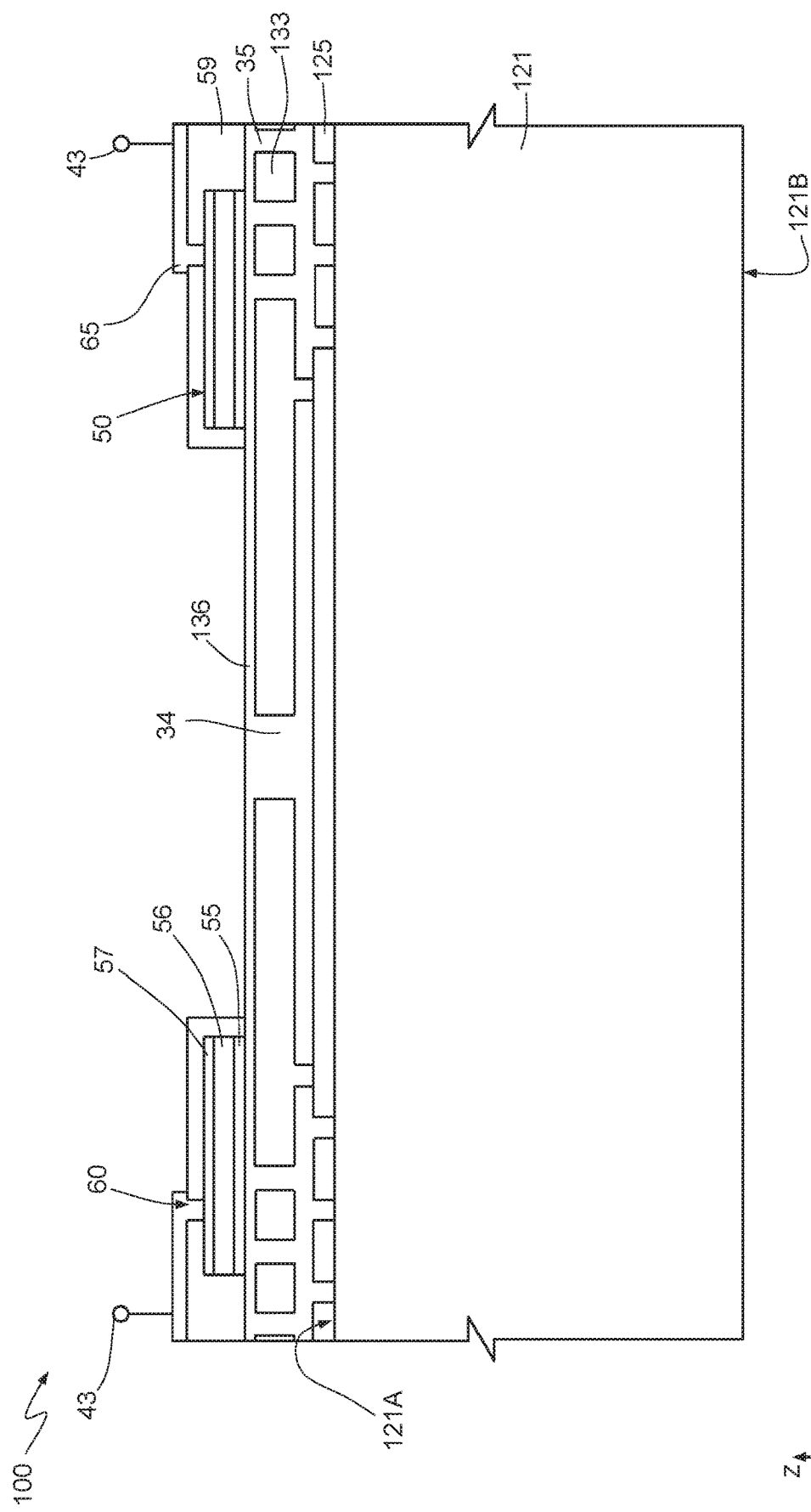
Figure 9:
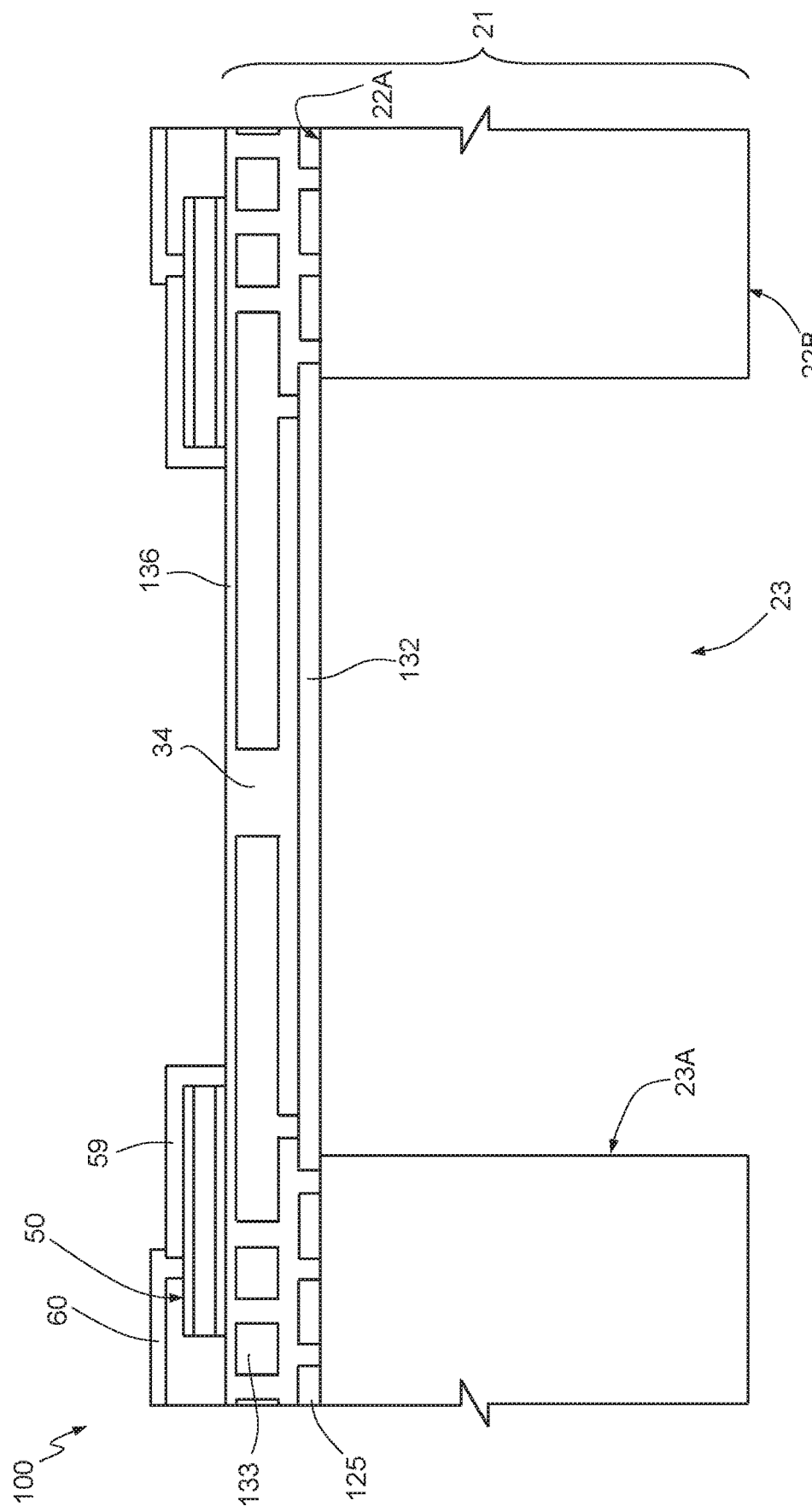

The second structural layer 38 is, for example, of polysilicon or silicon nitride ($Si_3N_4$) and has the same thickness and characteristics as the beams 39, being formed simultaneously therewith, as described hereinafter with reference to FIGS. 7 and 8.

The first anchorage elements 31 extend through the first dielectric layer 25 between the substrate 22 and the first structural layer 37. The first anchorage elements 31 thus have the same thickness as the first dielectric layer 25 (measured along axis Z of the reference system XYZ), and are monolithic with the membrane 32, being formed in the same manufacturing step, as described hereinafter with reference to FIG. 6.

In the illustrated embodiment, a recess 40 extends between the first structural layer 37, the first anchorages 31, and the substrate 22 is recessed with respect to the wall 23A of the through cavity 23 and is, in top plan view (FIG. 3), for example circular-shaped. The recess 40 is not, however, essential and, in other embodiments, may be missing.

The second anchorage elements 35 extend through the second dielectric layer 33, between the first and second structural layers 37, 38, and thus have the same thickness as the second dielectric layer 33.

According to FIG. 3, the mobile portion 30B here comprises eight beams 39, radially arranged and vertically aligned to the membrane 32, even if the number of beams is only exemplary and may vary. Each beam 39 has a first end 41 and a second end 42. In detail, each beam 39 is monolithically fixed, at the respective second end 42, to the pillar 34 and, through the respective first end 41, to the frame portion 30A of the sensitive region 36. In addition, each beam 39 is angularly evenly spaced with respect to the adjacent beams 39. In practice, in the example illustrated, the beams 39 are arranged at an angular distance of 45°.

The sensitive region 36 further comprises a plurality of sensing elements 50, each arranged at the first end 41 of a respective beam 39 and precisely straddling the first end 41 and the frame portion 30A.

Each sensing element 50 (FIG. 3A) comprises a first electrode 55 (for example of molybdenum Mo, doped polysilicon, titanium Ti, or platinum Pt); a piezoelectric material layer 56 (for example, aluminum nitride, AlN), arranged on the first electrode 55; and a second electrode 57 (for example of titanium or molybdenum), arranged on the piezoelectric material layer 56.

Furthermore (FIG. 3A), a passivation layer 59 (not illustrated in FIG. 3 for clarity), for example of silicon nitride $Si_3N_4$, silicon carbide SiC, or aluminum nitride AlN, extends on the frame portion 30A of the sensitive region 36 made, and coats the sensing elements 50. The passivation layer 59 has a plurality of contact openings 60; portions of a metallization layer 65 (not illustrated in FIG. 3), for example, of an alloy of titanium-tungsten and gold TiW/Au, of aluminum Al, or of an aluminum and copper alloy AlCu, extend inside the contact openings 60 to enable electrical contact of the second electrodes 57. The metallization layer 65, as well as further electrical-contact regions not illustrated, enable electrical coupling of the sensing elements 50 to external processing circuits and devices (not illustrated), in a per se known manner and schematically represented in FIG. 3 by electrical lines 43.

In use, an acoustic pressure wave acts on the membrane 32, exerting thereon a force that deflects the membrane 32 without deforming it; the force exerted by the acoustic pressure wave on the membrane 32 is then transmitted, concentrated, by the pillar 34 to the second end 42 of the plurality of beams 39, maximizing displacement (and thus deflection) of the plurality of beams 39 at the second end 42. In other words, the mobile portion 30B of the sensitive region 36 moves according to a piston-like movement because of displacement of the membrane 32 and of the pillar 34, so that the plurality of beams 39 moves according to a lever-arm effect as a result of the force exerted by the external acoustic pressure.

Deflection of the sensitive region 36 consequently generates a stress accumulation and, thus, a maximum strain (in absolute value) at the first and second ends 41, 42 of the beams 39; the accumulation of stress is then detected, on the first end 41, by the sensing elements 50, the layers of piezoelectric material 56 whereof are deformed by the stress. Consequently, according to the known inverse piezoelectric effect, deformation of the piezoelectric material layer 56 causes a charge accumulation between the first and second electrodes 55, 57, which, in turn, generates a corresponding electrical signal; the electrical signal is then transmitted to external processing circuits and devices through the metallization layer 65 (electrical lines 43).

Figure 4:
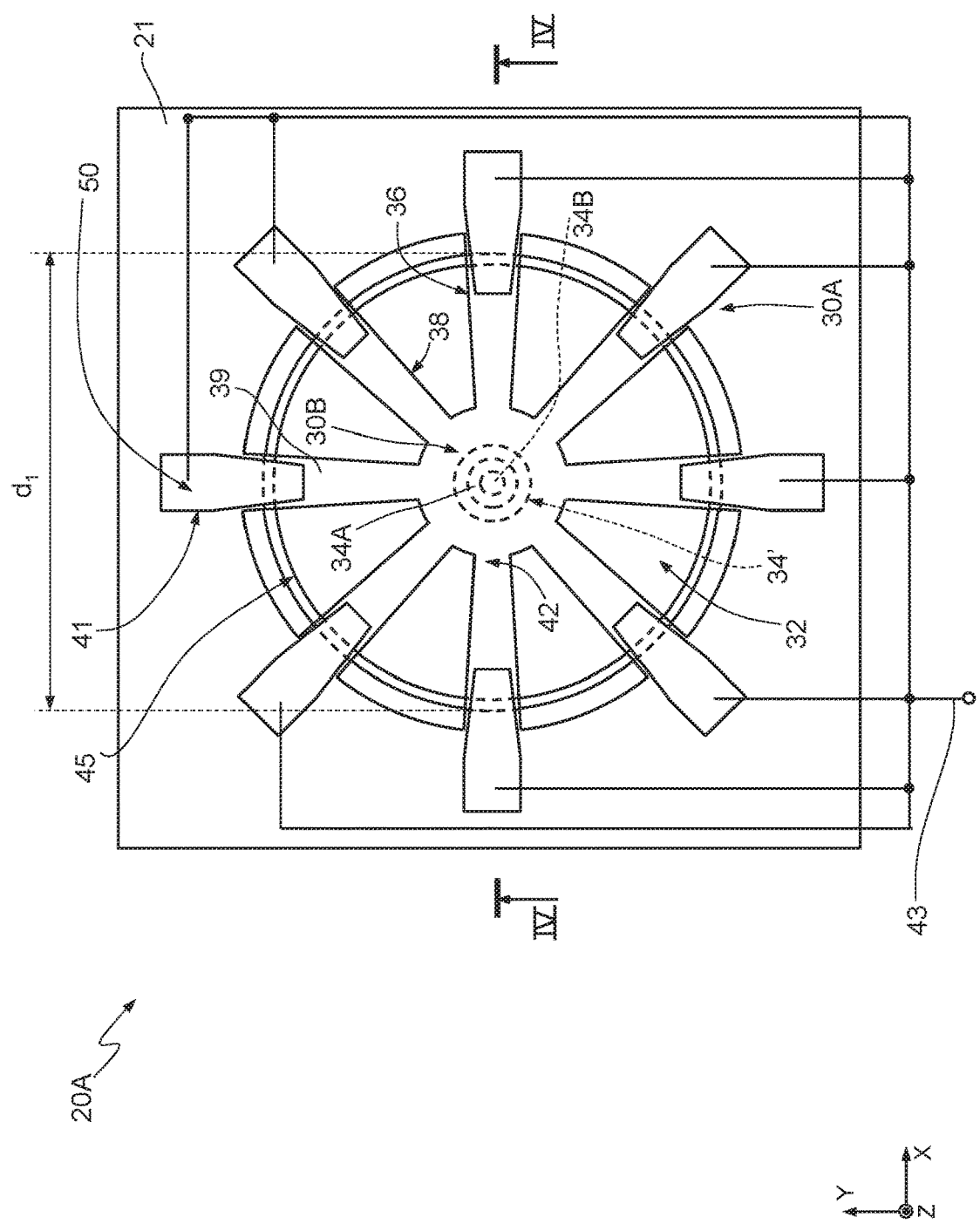
FIGS. 4 and 4A show a different embodiment of the present transducer, respectively in top plan view and in the same cross-section as FIG. 3A.
Figure 4A:
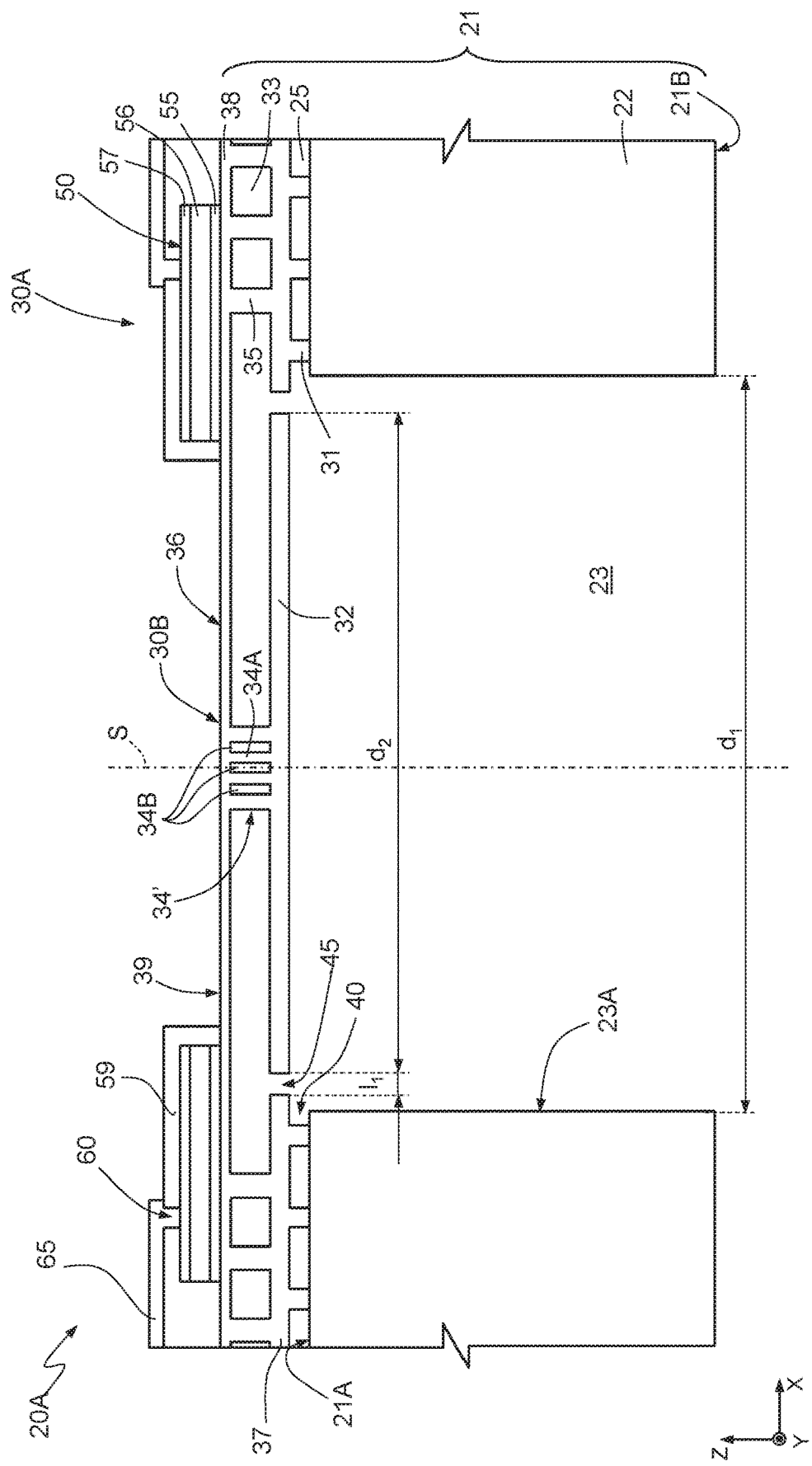

FIGS. 4 and 4A show another embodiment of the present MEMS transducer.

In detail, FIGS. 4 and 4A show a MEMS transducer 20A having a general structure similar to the MEMS microphone 20 of FIGS. 3 and 3A so that parts similar to those illustrated and described with reference to FIGS. 3 and 3A are designated in FIGS. 4 and 4A by the same reference numbers and will not be described any further.

In the MEMS transducer of FIGS. 4 and 4A, the pillar, designated by 34', is formed by alternating polysilicon regions 34A and dielectric regions 34B; for example, in FIGS. 4 and 4A, the pillar 34' is formed by concentric annular columns of polysilicon 34A (which are monolithic and are obtained starting from the same material as the beams 39) and of concentric dielectric annular columns 34B (simultaneously formed with the second dielectric layer 33).

FIGS. 5-9 show successive steps of a process for fabricating the MEMS microphone 20.

In particular, FIG. 5 shows a wafer 100 of semiconductor material, for example silicon, for a part where a MEMS transducer having the structure illustrated in FIGS. 3 and 4 will be formed. The wafer 100 comprises a substrate 121, having a first substrate surface 121A and a second substrate surface 121B. Using known deposition techniques, a first sacrificial layer 125 has already been deposited on the first substrate surface 121A. The first sacrificial layer 125, for example, of USG, thermal silicon oxide, or TEOS and having a thickness comprised, for example, between 0.5 μm and 2.6 μm, is also designed to form the first dielectric layer 25.

Moreover, the first sacrificial layer 125 has already been defined according to known masking and definition techniques so as to form a first plurality of anchorage openings 131'.

Figure 6:
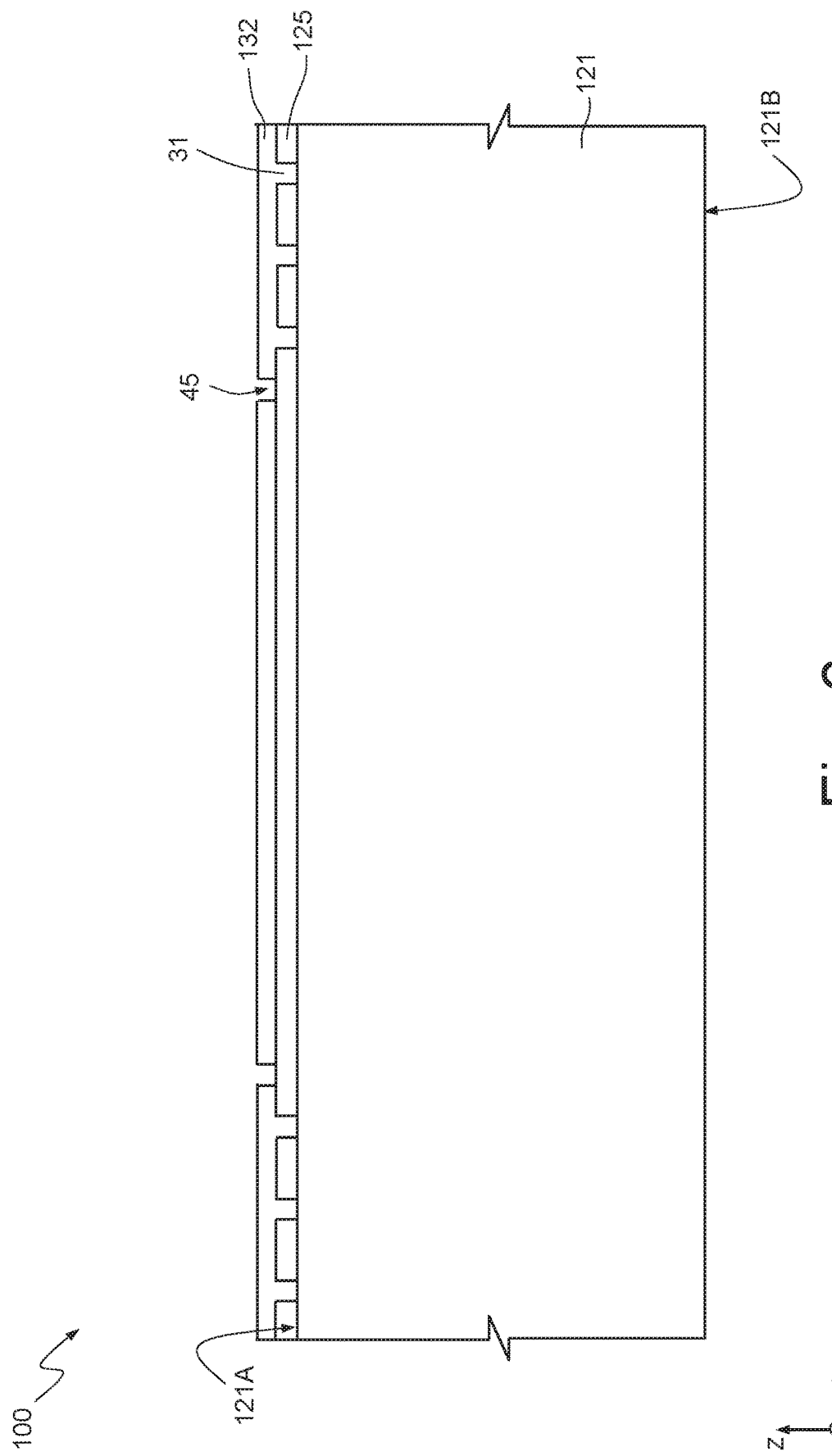

In FIG. 6, a first transduction layer 132 is deposited or grown on the first sacrificial layer 125 and is intended to form the membrane 32 and the first structural layer 37. The first transduction layer 132 is, for example, of polysilicon and has a thickness comprised, for example, between 1 μm and 2 μm; it fills the first plurality of anchorage openings 131', thus forming the first anchorage elements 31.

Next, the first transduction layer 132 is defined according to known photolithographic techniques so as to form the ventilation opening 45.

Then (FIG. 7), a second sacrificial layer 133 is deposited on the first transduction layer 132; in particular, the second sacrificial layer 133, also designed to form the second dielectric layer 33, is, for example, of USG, TEOS, or doped silicon oxides with a thickness, for example, comprised between 1 μm and 4 μm, and fills the ventilation opening 45.

Next, the second sacrificial layer 133 is defined using photolithographic techniques known per se so as to form a second plurality of anchorage openings 133' (arranged in a peripheral area of the second sacrificial layer 133 which is designed to form the frame portion 30A of the sensitive region 36) and a pillar opening 133", arranged in a central portion of the second sacrificial layer 133, where the pillar 34 is to be formed.

In the embodiment of FIGS. 4 and 4A, instead of providing a single pillar opening 133", using a different lithographic mask, a series of concentric annular openings is formed where the polysilicon portions 34A are to be formed so as to obtain the structure illustrated in the aforementioned figures.

Next (FIG. 8), a second transduction layer 136, for example, of polysilicon or silicon nitride with a thickness comprised between 1 μm and 3 μm, is deposited or grown on the second sacrificial layer 133 and is designed to form the second structural layer 38 and the beams 39. In detail, the second transduction layer 136 fills the second plurality of anchorage openings 133', thus forming the second anchorage elements 35, and the pillar opening 133", thus forming the pillar 34. Then, the plurality of beams 39 is formed by defining the second transduction layer 136 according to known photolithographic definition techniques.

Next, the sensing elements 50 are formed in the area that is designed to form the frame portion 30A of the sensitive region 36. In particular, the first electrode 55, the piezoelectric material layer 56, and the second electrode 57 are deposited in sequence. Next, the stack thus formed is defined in a per se known manner (for example, using photolithographic techniques). Then, the passivation layer 59 is deposited and defined on the sensing elements 50, in a per se known manner, to form the plurality of contact openings 60. Next, the metallization layer 65 is deposited and defined on the passivation layer 59 so as to form the electrical lines 43.

Next (FIG. 9), the wafer 100 is etched from the second substrate surface 121B according to known etching techniques (for example, dry etching such as DRIE, Deep Reactive-Ion Etching); in particular, the etching proceeds until the first sacrificial layer 125, which acts as etch-stop layer, is reached. In this way, at the end of etching, the substrate 22 (and, thus, the first and second surfaces 22A, 22B) and the through cavity 23 (and, thus, the wall 23A of the through cavity 23) are obtained. Next, a wet or vapor etching is carried out (for example, using HF, hydrofluoric acid) so as to remove the portions of the first and second sacrificial layers 125, 133 facing the through cavity 23. Consequently, at the end of the process, the first and second transduction layers 132, 136 are suspended over the cavity 23, thus releasing the mobile portion 30B of the sensitive region 36, the membrane 32, the pillar 34, and the beams 39, so as to obtain the sensitive region 36 illustrated in FIG. 3A. In addition, removal of the first and second sacrificial layers 125, 133 leads to formation of the recess 40 and to delimitation of the transduction frame 36, in particular of the first and second dielectric layers 25, 33, as well as the first and second structural layers 37, 38.

Then, the wafer 100 is diced, thus obtaining one or more MEMS transducers 20 that have the basic structure represented in FIGS. 3 and 3A.

Figure 10:
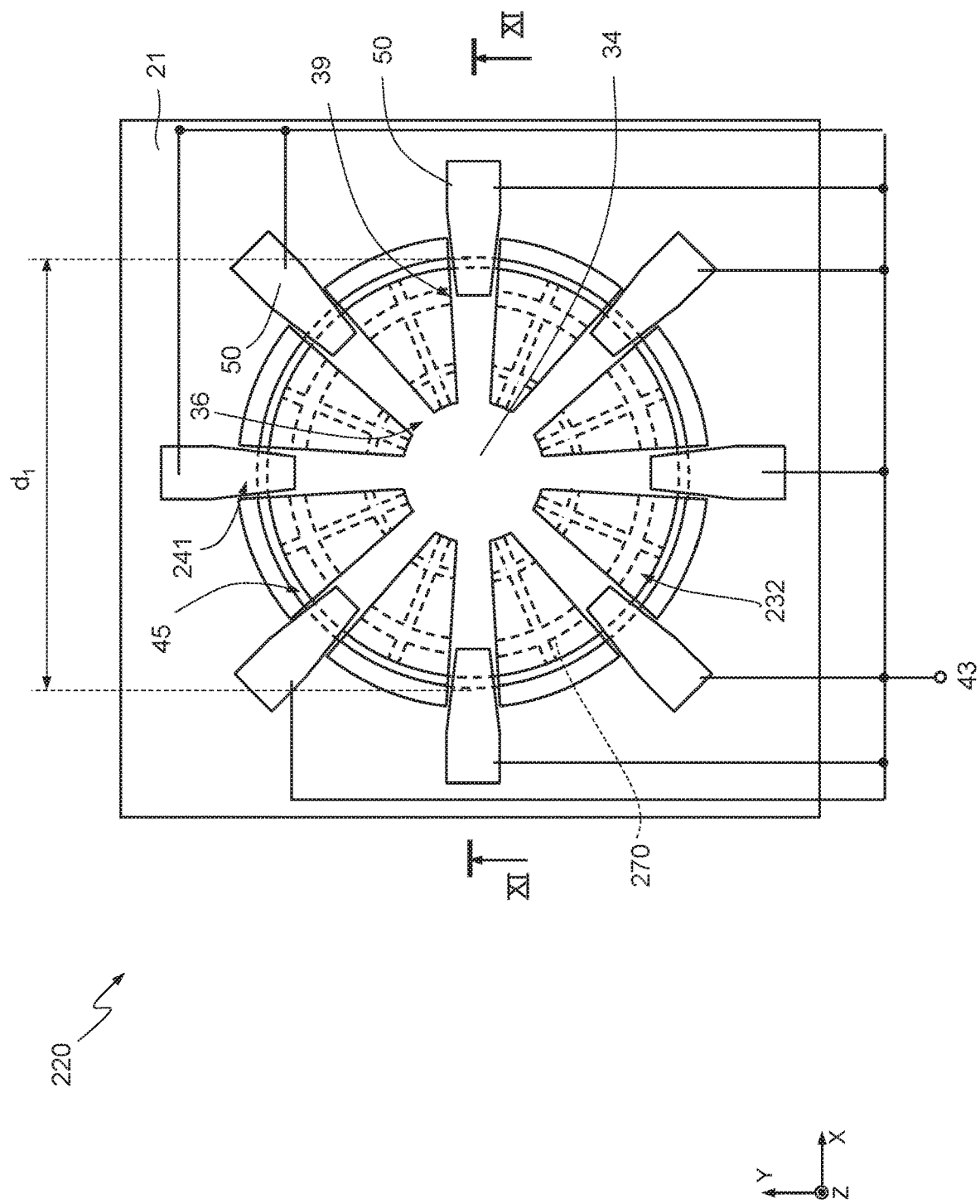
FIG. 10 is a top plan view with parts removed of the present transducer according to another embodiment.
Figure 11:
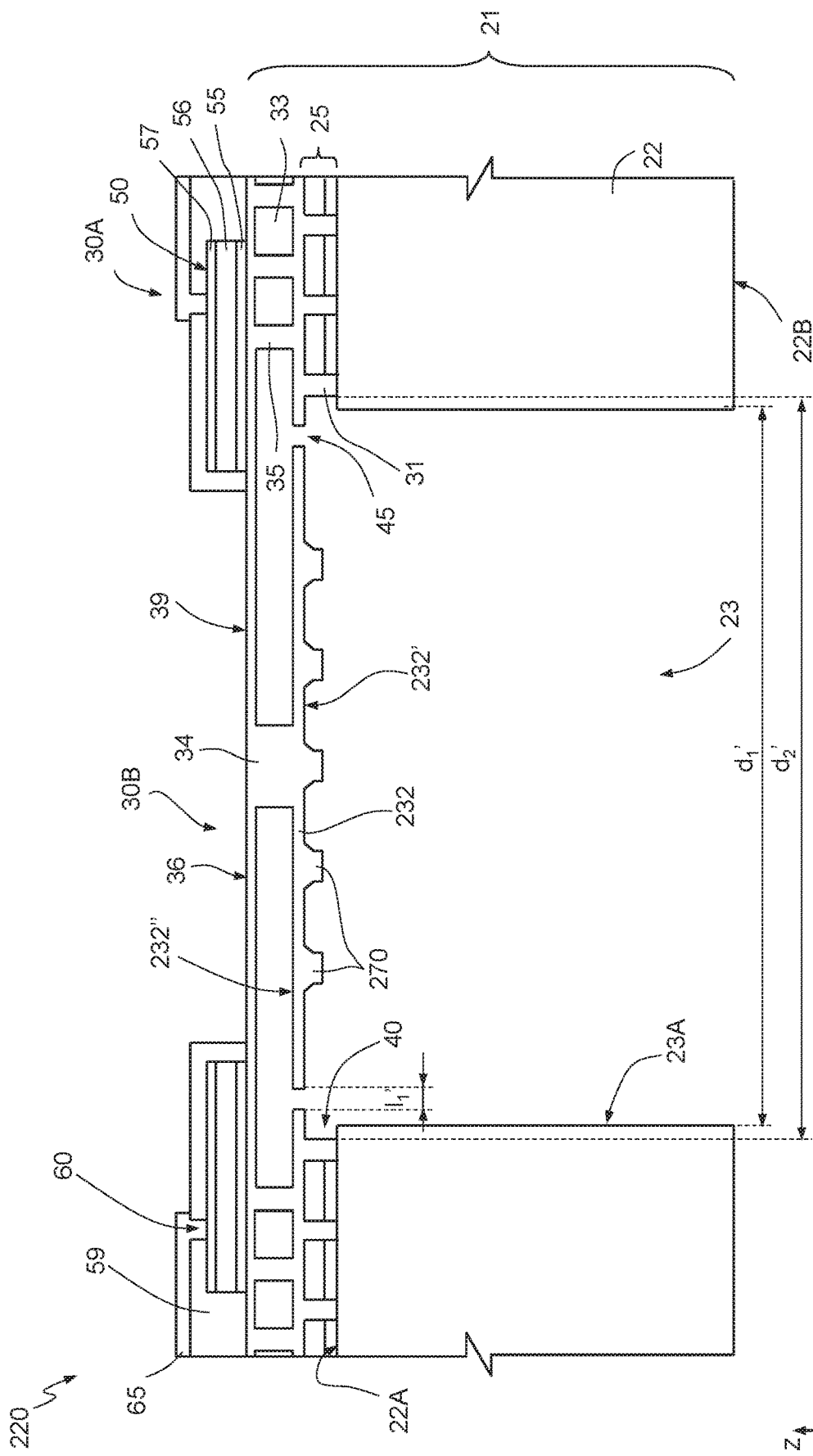
FIG. 11 is a cross-section taken along section line XI-XI of the transducer of FIG. 10.

FIGS. 10 and 11 show another embodiment of the present MEMS transducer.

In detail, FIGS. 10 and 11 show a MEMS transducer (also referred to hereinafter as "MEMS microphone 220") having a general structure similar to that of the MEMS microphone 20 of FIGS. 3 and 3A so that parts that are similar to those illustrated and described with reference to FIGS. 3 and 3A are designated in FIGS. 10 and 11 by the same reference numbers and will not be described any further.

In greater detail, in the MEMS microphone 220 of FIGS. 10 and 11, the membrane 232 has a bottom surface 232' facing the through cavity 223, and a top surface 232'', facing the beams 39. Moreover, the membrane 232 comprises a reinforcement structure 270, monolithic with the membrane 232. In particular, the reinforcement structure 270 extends on the bottom surface 232' of the membrane 232 (FIG. 11).

The reinforcement structure 270 has, for example, a cobweb shape, as visible in the top plan view of FIG. 10 and represented in dashed. In particular, the reinforcement structure 270 has the function of increasing stiffness of the membrane 232, without adding any further and significant mass contributions of the membrane 232. In this way, it is possible to have a thin and undeformable membrane 232 (for example, with a thickness of 0.3 μm), the MEMS microphone 220 is less subject to vibrations and external mechanical shock and transfers the force generated by the acoustic pressure acting on the membrane 232 in an efficient way.

Consequently, transmission of the stress, caused by the acoustic pressure, to the first and second ends 41, 42 of the beams 39 is optimized as compared to the MEMS microphone 20.

Figure 12:
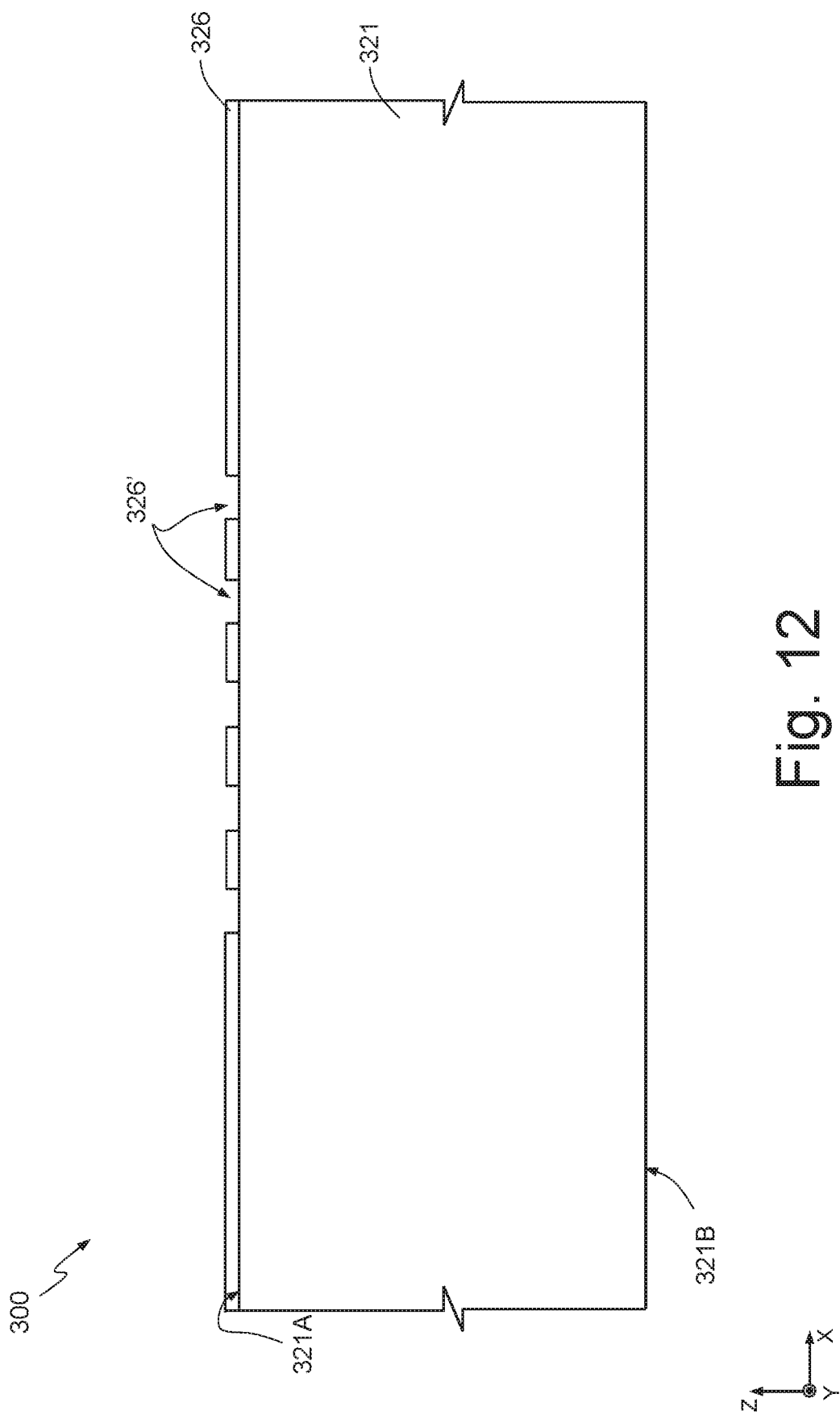
FIGS. 12-14 are cross-sections of the transducer of FIG. 10, in successive steps of the fabrication process.
Figure 13:
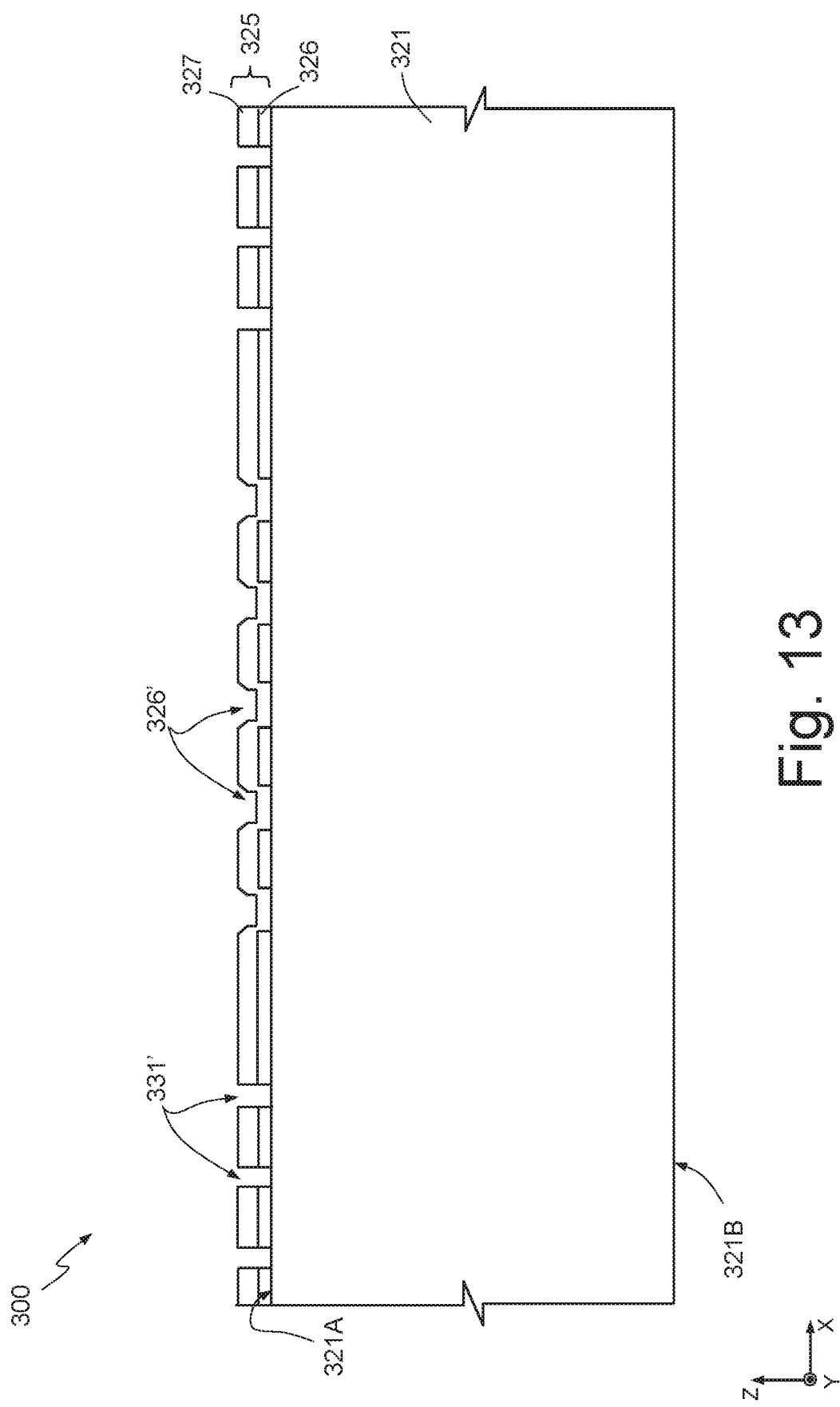
Figure 14:
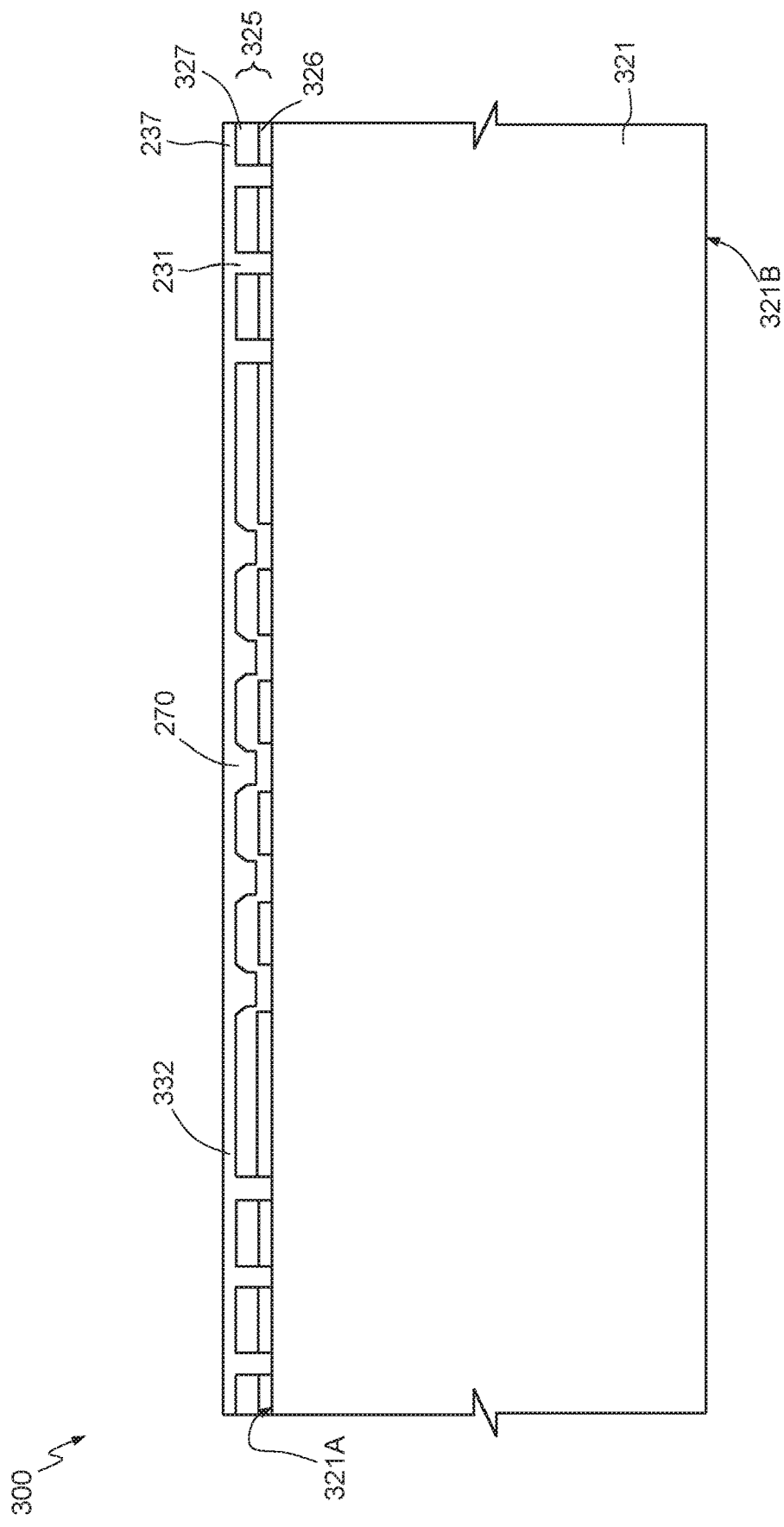

FIGS. 12-14 show successive steps of an embodiment of a process for fabrication of the MEMS microphone 220.

In particular, FIG. 12 shows a wafer 300 of semiconductor material, for example silicon, regarding a part where a MEMS transducer having the simplified structure illustrated in FIGS. 10 and 11 is to be provided. A first membrane-definition layer 326, for example of USG, thermal silicon oxide, or TEOS and having a thickness, for example, comprised between 0.5 μm and 2.6 μm is deposited and defined in a per se known manner on the first substrate surface 321A of the substrate 321. The first membrane-definition layer 326 is defined so as to form a plurality of reinforcement definition openings 326'.

Next (FIG. 13), a second membrane-definition layer 327, for example of USG or TEOS (of a thickness, for example, of between 0.5 μm and 2 μm) is conformally deposited on the first membrane-definition layer 326. The second membrane-definition layer 327 fills in part the plurality of reinforcement definition openings 326', so as to define, in subsequent process steps, the reinforcement structure 270. In particular, the ensemble of the first and second membrane-definition layers 326, 327 is equivalent to the first sacrificial layer 125 of FIGS. 5-9, and, since they are of the same material, after deposition, they are in general undistinguishable; consequently, hereinafter this ensemble will be referred to as "first sacrificial layer 325". Next, the first sacrificial layer 325 is defined using known masking and definition techniques so as to form the first plurality of anchorage openings 331'.

Then (FIG. 14), the first transduction layer 332, for example of polysilicon, is deposited or grown on the second membrane-definition layer 327 and fills the first plurality of anchorage openings 331' and the plurality of reinforcement definition openings 326', thus forming the first anchorage elements 31 and the reinforcement structure 270.

Next, fabrication steps are carried out similar to those described with reference to FIGS. 6-9 and comprising forming the ventilation opening 45; depositing and patterning the second sacrificial layer (not visible, corresponding to the layer 133 of FIG. 7); forming and patterning the second transduction layer (corresponding to the layer 136 of FIG. 8); providing the sensing elements 50 and executing the final steps.

FIGS. 15A-15G show alternative embodiments of the transduction frame 36 and/or of the membrane 32, 232 of the MEMS microphones 20, 220 of FIGS. 3-3A and 10-11, respectively. In particular, in FIGS. 15A-15G, for a better understanding of the various embodiments, the reinforcement structure 270, the passivation layer 59, and the metallization layer 65 are not illustrated.

Figure 15A:
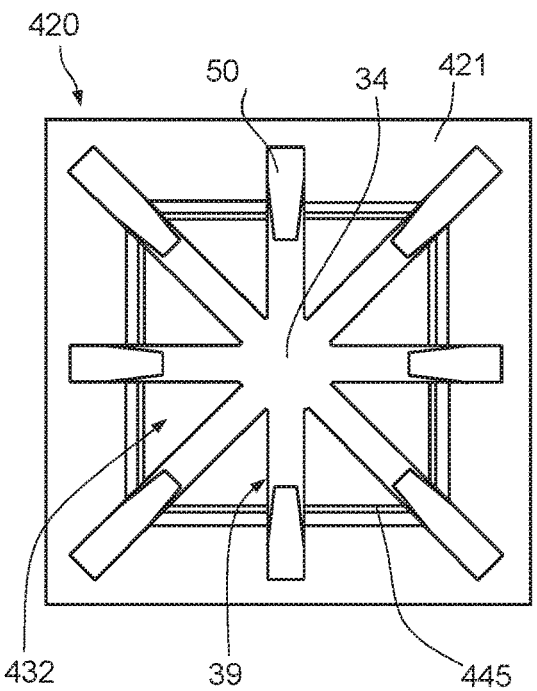
FIGS. 15A-15G are top plan views with parts removed of further embodiments of the present transducer.

With reference to FIG. 15A, parts that are similar to the ones illustrated and described with reference to the MEMS microphone 20 of FIGS. 3 and 3A are designated by the same reference numbers and will not be described any further.

In particular, the top plan view of FIG. 15A shows a variant of the MEMS microphone 420 wherein the membrane 432, the recess (not illustrated), and the ventilation opening 445 have a quadrangular (for example, square) shape in order to maximize the area of the membrane 432 where the incident sound wave impinges, for same dimensions of the body, here designated by 421.

Figure 15B:
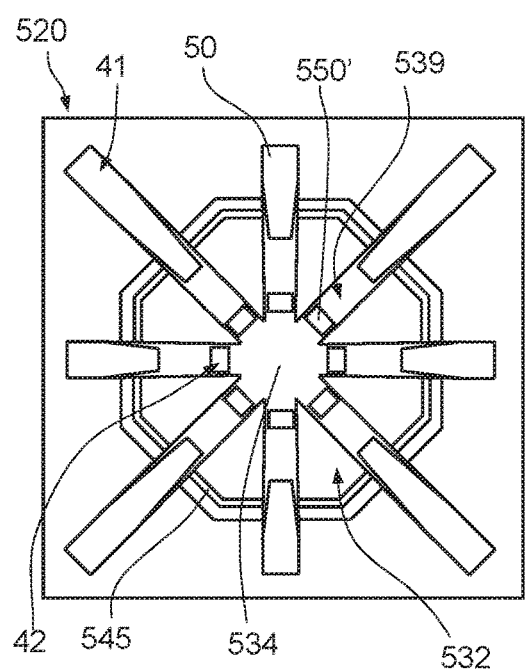

In FIG. 15B, parts that are similar to those illustrated and described with reference to the MEMS microphone 20 of FIGS. 3 and 3A are designated by the same reference numbers and will not be described any further.

In particular, here the membrane 532, the recess (not illustrated), and the ventilation opening 545 have a polygonal (for example, octagonal) shape. In addition, each beam 539 carries further sensing elements 550', arranged in proximity of the pillar 534. In detail, each further sensing element 550' is arranged on a corresponding beam 539 at the respective second end 542.

This embodiment may advantageously be used in applications where it is desirable for the MEMS microphone 520 to have a higher sensitivity. In fact, in use, each further sensing element 550', in a way similar to the sensing elements 550, is subjected to a high stress, due to deformation of the respective beam 539, and generates a corresponding electrical signal.

Figure 15C:
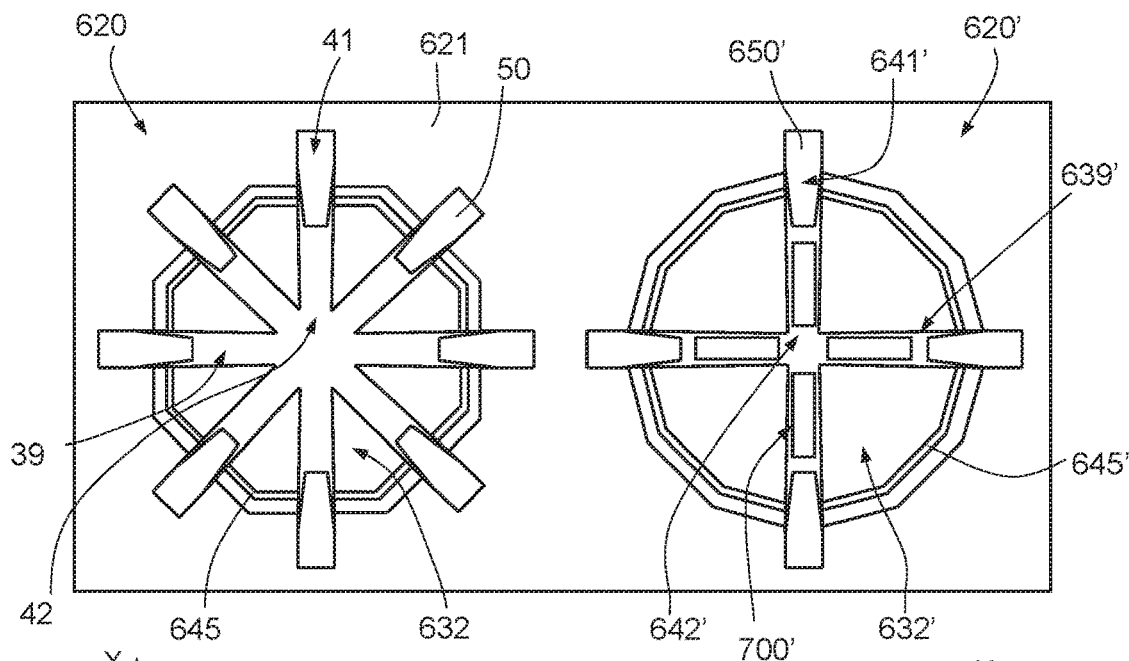

With reference to FIG. 15C, parts that are similar to those illustrated and described with reference to the MEMS microphone 20 of FIGS. 3 and 3A are designated by the same reference numbers and will not be described any further.

FIG. 15C illustrates the MEMS microphone 620 (also referred to hereinafter as "first MEMS microphone 620") and an additional MEMS transducer (also referred to hereinafter as "additional MEMS microphone 620'"), both formed in the same body 621. In particular, the first MEMS microphone 620 here has a membrane 632, a recess (not illustrated), and a ventilation opening 645 of a polygonal (for example, dodecagonal) shape. Moreover, the additional MEMS microphone 620' has a general structure similar to that of the MEMS microphone 20 of FIGS. 3 and 3A, so that parts that are similar to those illustrated and described with reference to FIGS. 3 and 4 are designated in FIG. 15C by the same reference numbers and will not be described any further.

In FIG. 15C, the additional MEMS microphone 620' has four beams 639' (arranged in pairs parallel to the first axis X and to a third axis Y of the Cartesian reference system XYZ) and corresponding sensing elements 620' are arranged thereon, at the respective first ends 641'. Moreover, each beam 639' has a respective beam opening 700', which extends through the respective beam between the first and second ends 641', 642'. Here, the membrane 632', the recess (not illustrated), and the ventilation opening 645' have polygonal (for example, octagonal) shape.

This embodiment enables detection of the sound at larger sound intensity ranges, without any loss of sensitivity. In fact, this embodiment allows stiffer beams to be obtained as compared to the embodiment described with reference to FIGS. 3, 3A, 10, and 11.

Figure 15D:
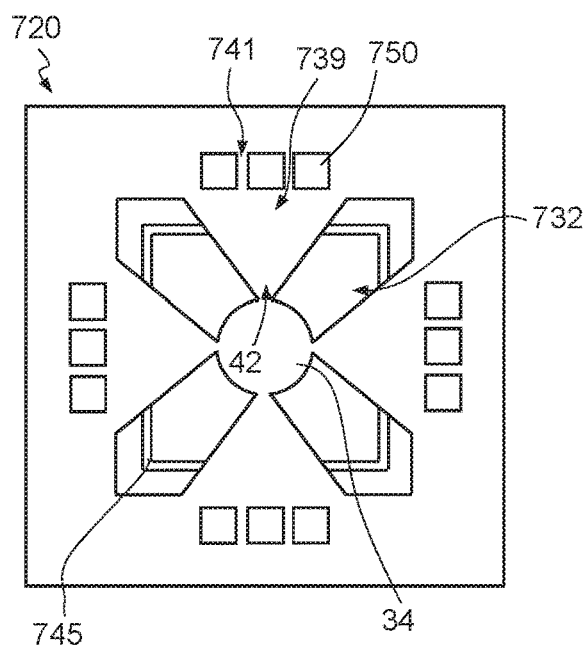

With reference to FIG. 15D, parts that are similar to those illustrated and described with reference to the MEMS microphone 20 of FIGS. 3 and 3A are designated by the same reference numbers and will not be described any further.

In FIG. 15D, the MEMS microphone 720 comprises four beams 739, that have, for example, a triangular shape, with a base (forming the first end 741) anchored to the substrate (not visible) and the vertex facing the center of the MEMS microphone 720. Each beam 739 has, at the respective first end 741, a respective sensing element 750, so that, in use, the stress accumulated at the first end 741 is detected by the sensing elements 750. Moreover, the membrane 732, the recess (not illustrated), and the ventilation opening 745 have a quadrangular (for example, square) shape.

This embodiment has the advantage of optimizing the electrical capacitance of the piezoelectric actuator 750, the voltage of the signal generated by the MEMS microphone 720 is to be read. In fact, in the present embodiment, optimization of the electrical capacitance makes it possible to have an improvement of the value of SNR of the MEMS microphone 720.

Figure 15E:
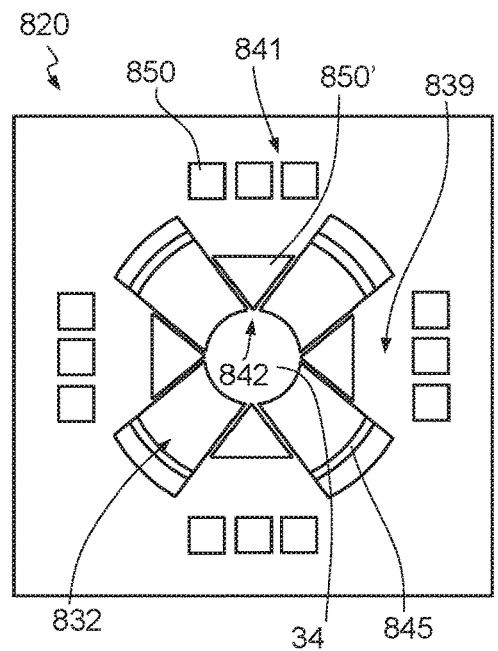

With reference to FIG. 15E, parts that are similar to those illustrated and described with reference to the MEMS microphone 20 of FIGS. 3 and 3A are designated by the same reference numbers and will not be described any further.

In particular, in FIG. 15E, MEMS microphone 820 has a shape similar to that illustrated in FIG. 15D. In particular, in FIG. 15E, the membrane 832, the recess (not illustrated), and the ventilation opening 845 have, for example, a circular shape. Moreover, each beam 839 has, at the respective first end 841, a plurality of sensing element 850, and at the respective second end 842, a further sensing element 850', similar to the further sensing elements 550' of FIG. 15B.

This embodiment may advantageously be used in applications where it is desirable for the MEMS microphone 820 to have a higher sensitivity.

Figure 15F:
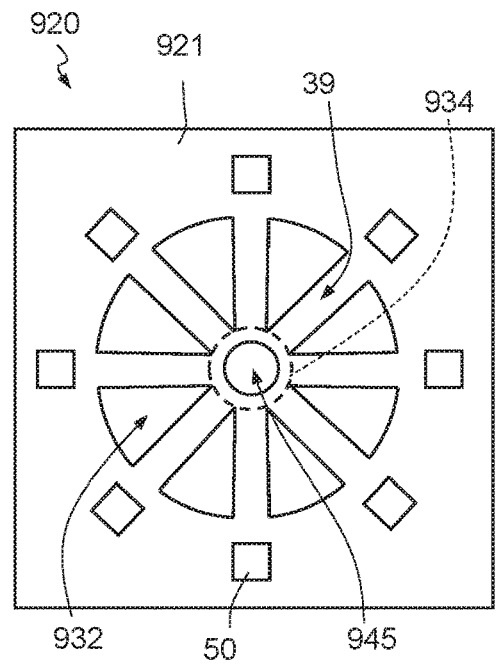

With reference to FIG. 15F, parts that are similar to those illustrated and described with reference to the MEMS microphone 20 of FIGS. 3 and 3A are designated by the same reference numbers and will not be described any further.

In FIG. 15F, the MEMS microphone 920 includes a ventilation opening 945 formed in the pillar 934. In addition, the membrane 932 is fixed with respect to the body 921 and proceeds without interruptions in the first structural layer (not illustrated). This embodiment may advantageously be used in applications where it is desirable to differently position the roll-off-frequency point, as, for example, in mobile applications.

Figure 15G:
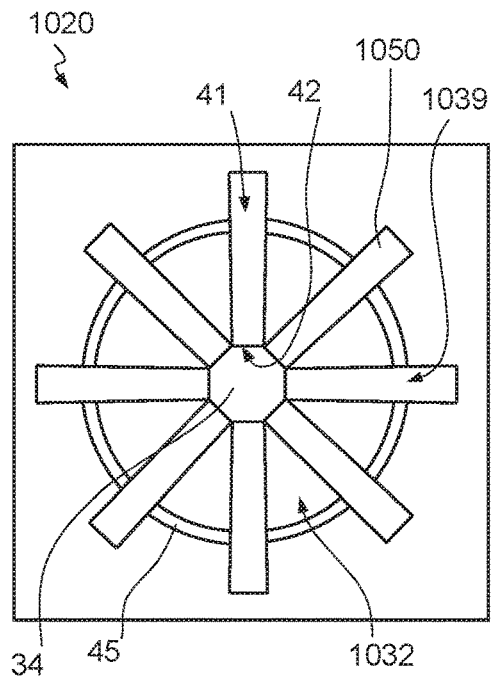

With reference to FIG. 15G, parts that are similar to the ones illustrated and described with reference to the MEMS microphone 20 of FIGS. 3 and 3A are designated by the same reference numbers and will not be described any further.

In FIG. 15G, each sensing element 1050 of the MEMS microphone 1020 extends throughout the length of the respective beam 1039 so as to entirely coat it. In this way, in use, each sensing element 1050 is able to detect the stress present throughout the extension of the corresponding beam 1039. In this way, the sensing elements 1050 have higher electrical capacitance. This characteristic is desirable on the basis of the architectural choices of the reading electronics, which can be coupled to the present MEMS microphone 1020.

Figure 16:
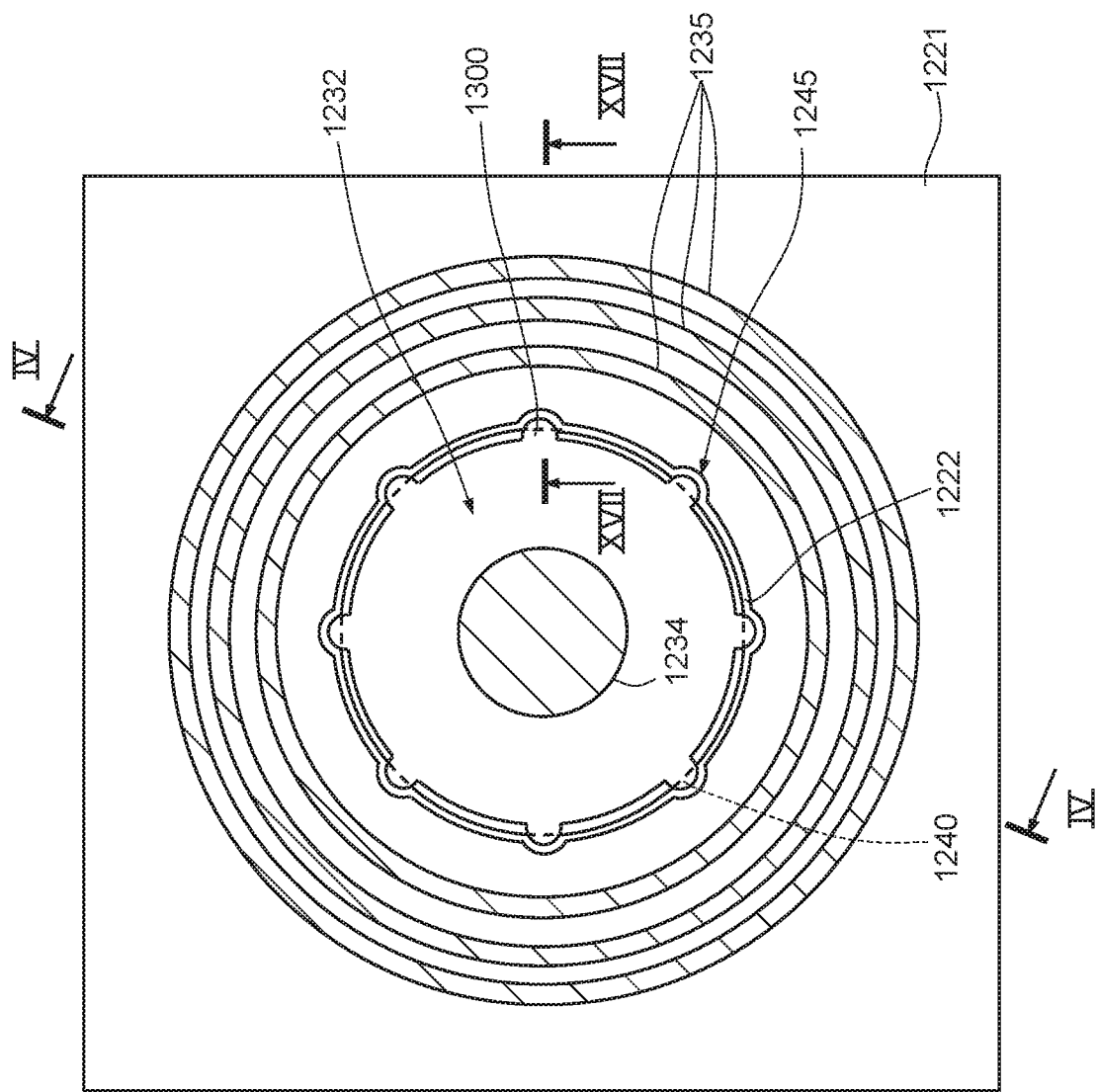
FIG. 16 is a planar cross section taken along section line XVI-XVI of FIG. 17 according to a further embodiment of the present MEMS transducer.
Figure 17:
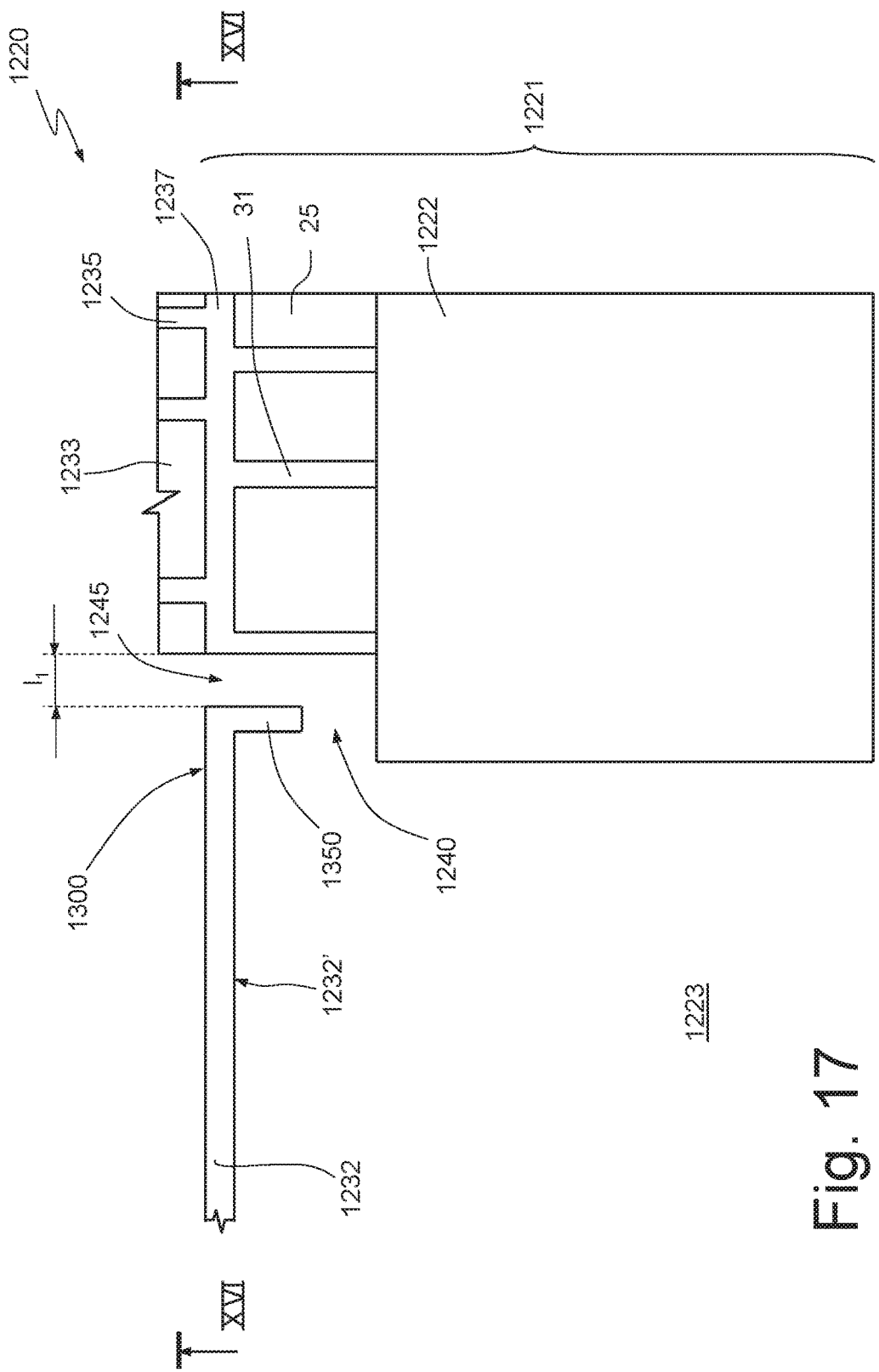
FIG. 17 shows a cross-section of a detail of the transducer of FIG. 16, taken along section line XVII-XVII of FIG. 16.

FIGS. 16 and 17 show another embodiment of the present MEMS transducer.

In detail, here, the MEMS transducer (also referred to hereinafter as "MEMS microphone 1220") has a general structure similar to the MEMS microphone 20 of FIGS. 3 and 3A, so that parts that are similar to those illustrated and described with reference to FIGS. 3 and 3A are designated in FIGS. 16 and 17 by the same reference numbers and will not be described any further.

In detail, the membrane 1232, of a generally circular shape in top plan view (FIG. 16), has a plurality of projections 1300, for example, of a semi-circular shape, monolithic with, and projecting from, the generally circular shape of the membrane 1232. Each projection 1300 is angularly evenly spaced with respect to the adjacent projection 1300; in practice, here, the projections 1300 are arranged at an angular distance of 45°, even though they could be at a different distance or even irregularly spaced. Moreover, the first structural layer 1237 is here patterned in a way complementary to the membrane 1232, so that the width $l_1$ of the ventilation opening 1245 is fixed, throughout the perimeter of the membrane 1232.

In practice, with this configuration, the membrane 1232 projects on the outside of the cavity 1223 and faces the substrate 1222 with the projections 1300. In this way, the vertical movement (parallel to the axis Z) of the membrane 1232 is limited by the interference between the projections 1300 and the substrate 1222, protecting the membrane 1232 from external mechanical impact that might break it and thus jeopardize operation of the MEMS transducer 1220, without, on the other hand, modifying substantially air flow through the ventilation opening 1245.

Furthermore, as visible in FIG. 17, the membrane 1232 may comprise an arrest element 1350 formed monolithically with the membrane 1232 on the first membrane surface 1232' and extending along the edge of the membrane 1232 towards the substrate 1222 of the body 1221 and spaced apart from the substrate 1222 by the recess 1240. In practice, the arrest element 1350 further limits the vertical movement of the membrane 1232. In this case, the height (measured along axis Z of the reference system XYZ) of the arrest element 1350 may be chosen so as not to modify the roll-off point of the MEMS microphone 1220.

The MEMS transducer 1220 includes plural anchorage elements 1235 spaced apart from each other by portions of a second dielectric layer 1233. The MEMS transducer 1220 may be manufactured according to any one of the fabrication processes described with reference to FIGS. 12-14, for example forming the arrest element 1350 with the same technique as for the reinforcement structure 270 (which may be present or not also in this embodiment).

Alternatively, in a further embodiment, the projections 1300 may be missing, and the membrane 1232 may have, for example, a circular shape with a greater diameter than the cavity 1223. In this case, the peripheral portion of the membrane overlies and faces the substrate 1222 to be limited in its movement along axis Z along its entire circumference. Also in this case, the arrest element of FIG. 17 may be present or not.

In the present MEMS transducer, manufactured according to any of the embodiments described with reference to FIGS. 3, 4, 6, 7, 15A-15G, 16, and 17, the piezoelectric sensing elements may have a bimorphous-piezoelectric-cell structure. In this case, the layered structure illustrated in FIGS. 3A and 11 is modified to obtain a bimorphous cell of the type schematically illustrated in FIGS. 18 and 19, regarding two different electrical-connection schemes.

Figure 18:
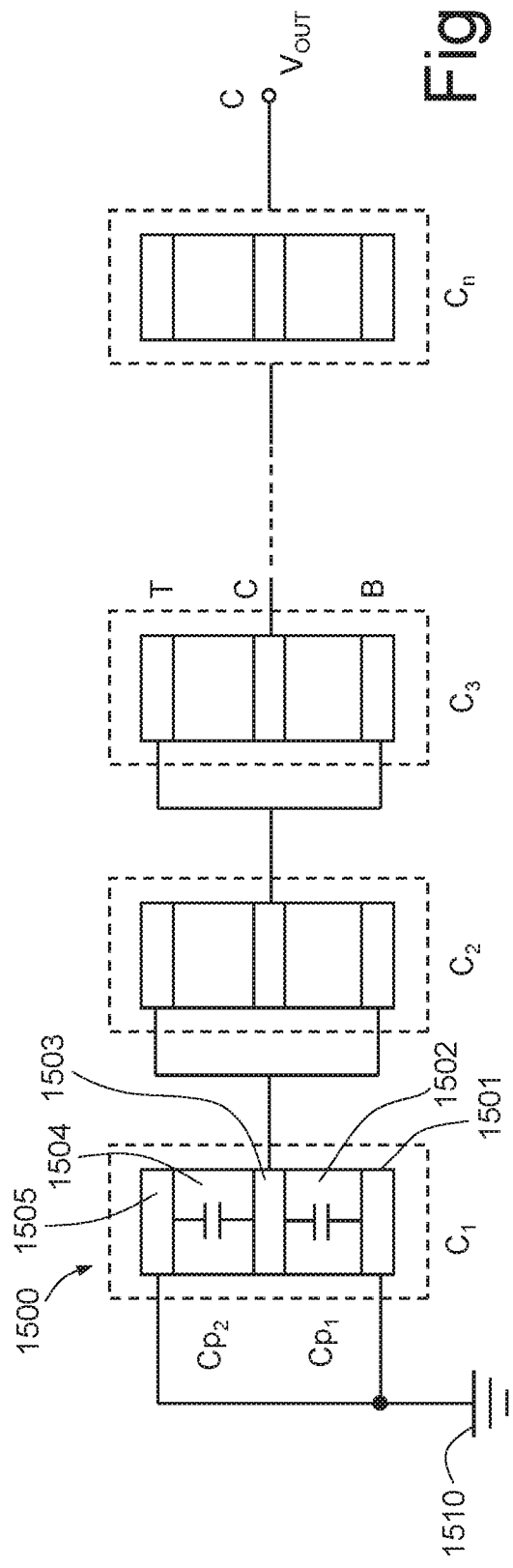
FIG. 18 is an electrical equivalent of the connection between the sensing elements of the present transducer according to another embodiment.
Figure 19:
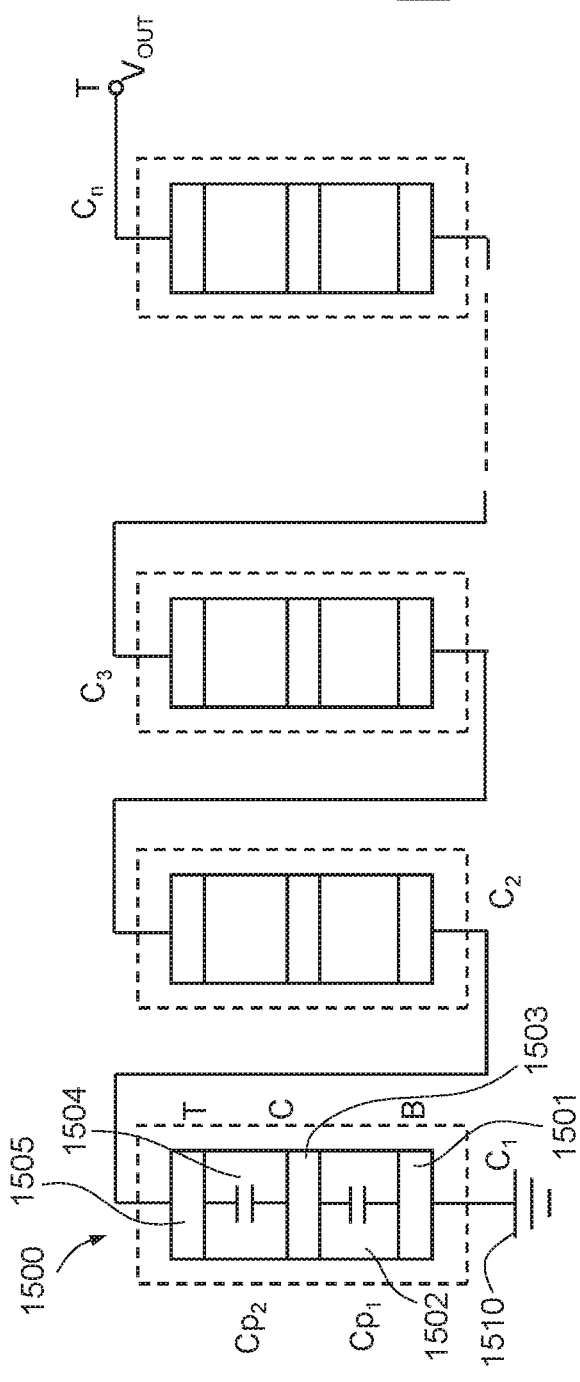
FIG. 19 is an electrical equivalent of another possible connection between the sensing elements of the present transducer according to another embodiment.

In detail, FIGS. 18 and 19 show a plurality of bimorphous cells 1500, here comprising n cells designated by $C_1$, $C_2$, $C_3$, . . . , $C_n$; in particular, each bimorphous cell 1500 is formed by a stack of five layers, namely a first electrode 1501, for example, of molybdenum Mo and forming a bottom terminal B; a first piezoelectric material layer 1502, for example, of aluminum nitride AlN; a second electrode 1503, for example, of molybdenum Mo and forming a central terminal C; a second piezoelectric material layer 1504, for example, of AlN; and a third electrode 1505, for example, of titanium and forming a top terminal T.

The first electrode 1501, the first piezoelectric material layer 1502, and the second electrode 1503 of each bimorphous cell 1500 form a first capacitor, having a first electrical capacitance $C_{p1}$. Likewise, the second electrode 1503, the second piezoelectric material layer 1504, and the third electrode 1505 of each bimorphous cell 1500 form a second capacitor, having a second electrical capacitance $C_{p2}$. In the embodiments illustrated by way of example in FIGS. 18 and 19, the first and second electrical capacitances $C_{p1}$, $C_{p2}$ are the same as one another and the electrical capacitances $C_{p1}$, $C_{p2}$ are the same in all the bimorphous cells 1500.

The bimorphous cells 1500 of FIG. 18 are connected to each other according to a series-of-parallels configuration, wherein the first bimorphous cell $C_1$ has the bottom terminal B and the top terminal T electrically coupled to a reference voltage 1510 (here, ground) and the central terminal C electrically connected both to the bottom terminal B and to the top terminal T of the next bimorphous cell (here the second bimorphous cell $C_2$). Likewise, the central terminal C of the second bimorphous cell $C_2$ is electrically coupled both to the bottom terminal B and to the top terminal T of the next bimorphous cell (here the third bimorphous cell $C_3$); this configuration is repeated for all the bimorphous cells 1500 up to the n-th bimorphous cell $C_n$, the central terminal C whereof supplies an output voltage $V_{out}$, cumulative of the voltage drops on each bimorphous cell 1500. Consequently, the present configuration is electrically equivalent to connecting the parallels of the first and second electrical capacitances $C_{p1}$, $C_{p2}$ of each bimorphous cell 1500 in series. This configuration is advantageously used in applications where it is desired for both the output voltage $V_{out}$ and the equivalent capacitance of the cells $C_1$, $C_n$ to be kept high.

With reference to FIG. 19, the bimorphous cells 1500 are connected together according to a series-of-series configuration, wherein the first bimorphous cell $C_1$ has the bottom terminal B electrically coupled to a reference voltage (ground) 1510 and the top terminal T electrically coupled to the bottom terminal B of the next bimorphous cell (here the second bimorphous cell $C_2$). This configuration is repeated for all the bimorphous cells 1500 up to the n-th bimorphous cell $C_n$, the top terminal T of which supplies an output voltage $V_{out}$ cumulative of the voltage drops on each bimorphous cell 1500. Consequently, the present configuration is electrically equivalent to connecting the series of the first and second electrical capacitances $C_{p1}$, $C_{p2}$ of each bimorphous cell 1500 in series.

The above configuration is advantageously used in applications where it is desirable to maximize the output voltage $V_{out}$ and minimize the equivalent capacitance between the cells $C_1$, $C_n$. In addition, in different embodiments, each beam of the present MEMS transducer may comprise a number of bimorphous cells, connected together according to any of the configurations discussed with reference to FIGS. 18 and 19.

Figure 20:
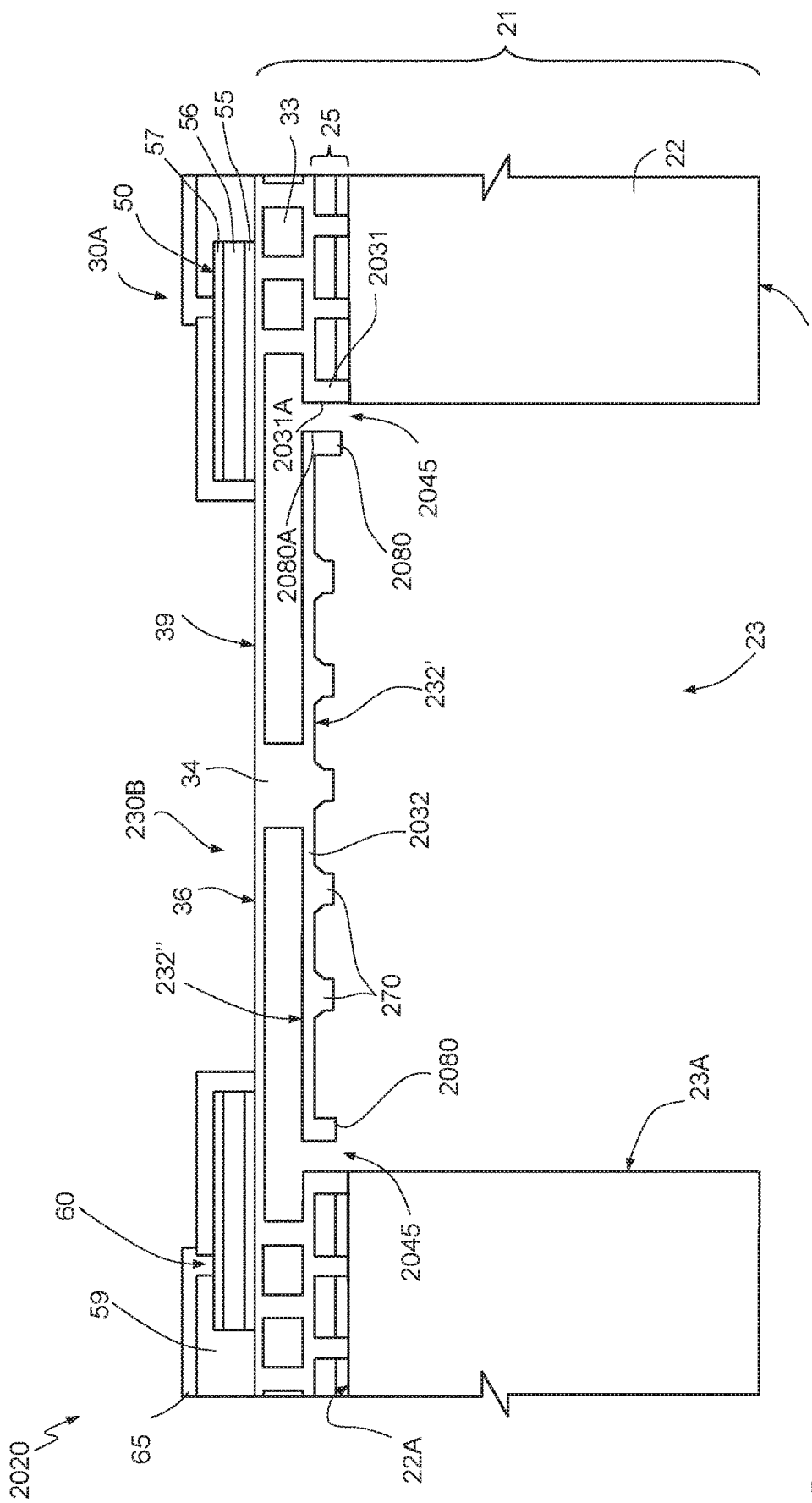
FIG. 20 is a cross-section view of a transducer according to another embodiment.

FIG. 20 shows MEMS transducer 2020 according to another embodiment of the present disclosure. In detail, FIG. 20 shows the MEMS transducer 2020 having a general structure similar to the MEMS transducer 220 of FIGS. 10-11 so that parts similar to those illustrated and described with reference to FIGS. 10-11 are designated in FIG. 20 by the same reference numbers and will not be described any further.

The MEMS transducer 2020 is substantially the same as the MEMS transducer 220 of FIGS. 10-11 except that the membrane 2032 of the MEMS transducer 2020 includes a downward protrusion 2080 and the recess 40 of the MEMS transducer 220 of FIGS. 10-11 is no longer present. The recess 40 is eliminated by positioning a lateral wall 2031A of one of the anchorage elements 2031 in line with the lateral wall 23A of the cavity 23. Without the recess 40, the ventilation opening 2045 is likewise aligned with the lateral wall 23A of the cavity.

Thus, the ventilation opening 2045 is a hole defined by larger facing surfaces, that is the lateral wall 2031A of the anchorage element 2031 and a lateral wall 2080A of the membrane protrusion 2080, compared to the facing surfaces of the ventilation opening of the MEMS transducer 220 of FIGS. 10-11. The increased vertical dimensions provided by the walls 2031A, 2080A of the ventilation opening 2045 allows an even better control of the roll-off frequency point (which determines the low-frequency behavior of the MEMS transducer 2020). The improved control of the roll-off frequency point arise because the larger facing surfaces 2031A, 2080A ensures that the shape of the ventilation opening 2045 is less modified during the membrane displacement compared to the relatively thinness of the ventilation opening 45 of the embodiments in FIGS. 3, 3A, 4, 4A, 10, and 11.

Figure 21:
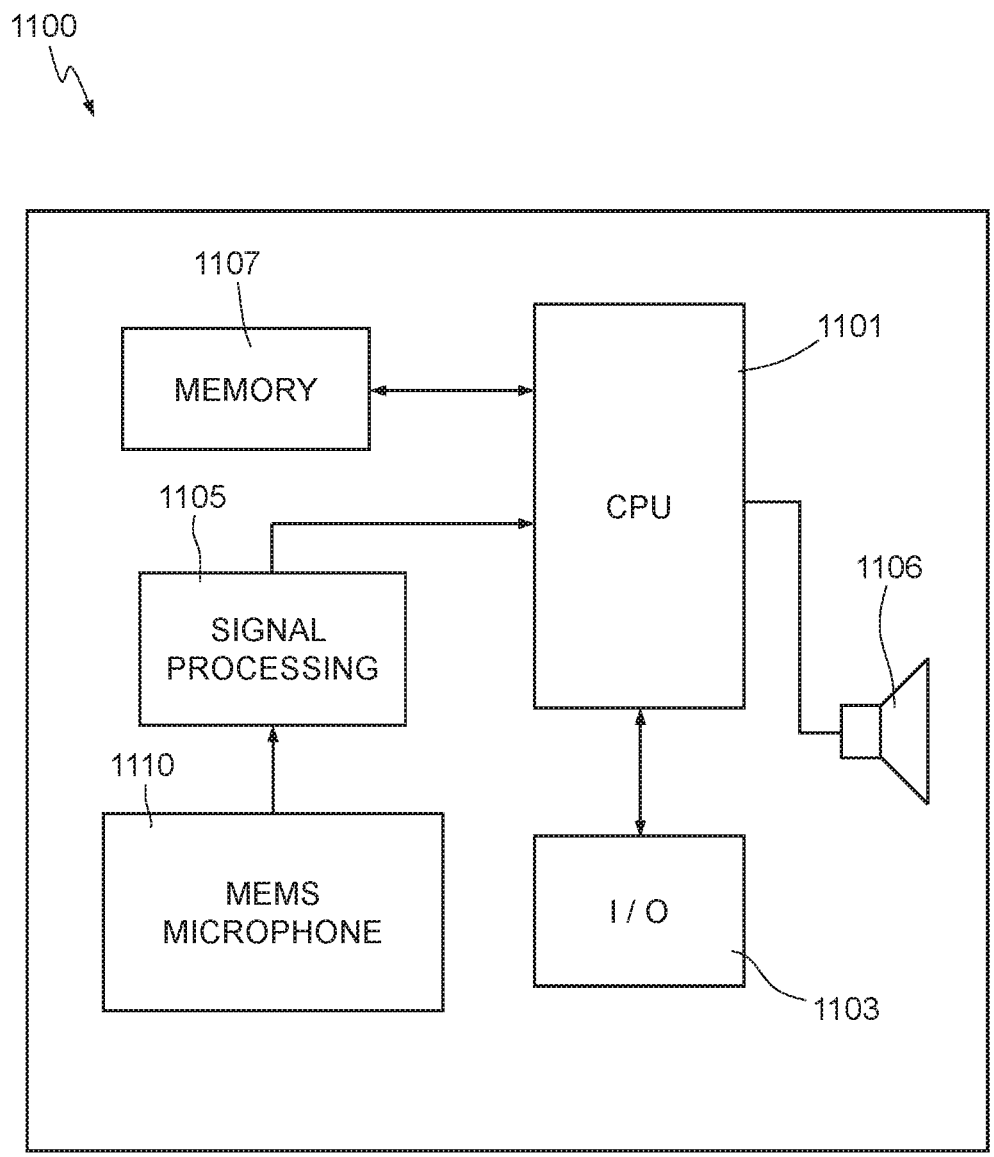
FIG. 21 shows a block diagram of an electronic apparatus comprising the present MEMS transducer.

The MEMS microphone illustrated in FIGS. 3, 4, 10, 11, 15A-15G, 16-17, and 20 may be used in an electronic device 1100, as illustrated in FIG. 21, which, for simplicity, is here designated by the reference number 1110; however, the electronic device 1100 may include any one of the embodiments discussed above.

The electronic device 1100 is, for example, a portable mobile communication device, such as a mobile phone, a PDA (Personal Digital Assistant), a notebook, but also a voice recorder, an audio-file player with voice-recording capacity, etc. Alternatively, the electronic device 1100 may be an acoustic apparatus, such as a head-set system, a hydrophone, that is able to work under water, or else a hearing-aid device.

The electronic device 1100 of FIG. 20 comprises a microprocessor 1101 and an input/output unit 1103, for example, provided with a keypad and of a display, connected to the microprocessor 1101. The MEMS microphone 1110 communicates with the microprocessor 1101 via a signal-processing block 1105 (which can carry out further processing operations on the analog or digital output signal m of the MEMS microphone 1110). In addition, the electronic device 1100 may comprise a speaker 1106, for generating sounds on an audio output (not illustrated), and an internal memory 1107.

The advantages of the present piezoelectric electroacoustic MEMS transducer clearly emerge from the foregoing description.

In particular, thanks to the structure of the mobile portion and positioning of the sensing elements on the ends of the beams the MEMS transducer has high sensitivity and low noise and, thus, high SNR; in fact, in use, the mobile portion performs a piston-like movement and the present configuration allows the lever-arm effect to be exploited, since the stress accumulated at the end of each beam is efficiently detected by the sensing elements.

Moreover, the sensitivity and flexibility of the mobile portion can be adjusted by appropriately configuring the beams (as illustrated, for example, in FIGS. 15C-15E).

In addition, the presence of a reinforcement structure on the membrane enables an increase in the pressure transmission efficiency; in fact, the reinforcement structure enables stiffening of the membrane without adding any significant contribution of mass, rendering it less subject to undesirable deflections. Consequently, in use, transmission of the stress to the ends of each beam is more efficient and contributes to rendering the MEMS microphone more sensitive.

Moreover, by positioning the sensing elements at the ends of each beam it is possible to reduce considerably the dependence of the sensitivity of the MEMS transducer upon the residual stress of the used piezoelectric materials. In fact, in this case, the sensing elements are arranged where the stress is maximum (in absolute value), and are thus able to detect the acoustic pressure in a precise way, with a higher sensitivity and with a lower contribution of noise.

In addition, the width of the ventilation opening is here precisely defined and according to known photolithographic techniques; this allows to precisely set, at a design level, the roll-off point, and, thus, the low-frequency behavior of the MEMS transducer. The roll-off point is consequently independent from possible residual stresses in the piezoelectric materials of the piezoelectric actuator.

Finally, the present MEMS transducer is resistant to water and liquid/solid contaminants/particulate coming from the outside since the sensing structure is of a piezoelectric type and does not have any parts where the contaminant can penetrate and obstruct the operating movement of the MEMS microphone.

Finally, it is clear that modifications and variations may be made to the MEMS transducer described and illustrated herein, without thereby departing from the scope of the present disclosure. For instance, the various embodiments described may be combined so as to provide further solutions. In particular, the beams, the membrane, the recess, and the ventilation opening may have different shapes. Moreover, all the membranes may have the reinforcement structure in all the embodiments.

Furthermore, the present MEMS microphone may have arrest elements in all presented embodiments, and the shapes may vary with respect to the ones illustrated.

In addition, a membrane protrusion like the protrusion 2080 of FIG. 20, together with a lack of recess 40, can be employed with the membranes of any of the embodiments presented herein.

The reinforcement structures of the membrane may be internal, i.e., facing the transduction frame.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A piezoelectric MEMS transducer, comprising:
a body of semiconductor material having a central axis and a peripheral area, the body including:
a plurality of beams extending transversely to the central axis and each having a first end and a second end, the first ends of the beams being coupled to the peripheral area of the body and the second ends facing the central axis;
a membrane extending transversely to the central axis and underneath the plurality of beams; and
a pillar extending parallel to the central axis and rigid with respect to the second ends of the beams and the membrane; and
a plurality of piezoelectric sensing elements arranged on the plurality of beams.

2. The transducer according to claim 1, wherein the plurality of piezoelectric sensing elements comprises piezoelectric sensing elements arranged at the first ends of the beams, respectively.

3. The transducer according to claim 1, wherein the plurality of piezoelectric sensing elements comprises piezoelectric sensing elements arranged at the second ends of the beams, respectively.

4. The transducer according to claim 1, wherein the piezoelectric sensing elements extend each along a respective beam, between the first end and the second end.

5. The transducer according to claim 1, wherein each beam includes an opening formed between the first end and the second end of the beam.

6. The transducer according to claim 1, further comprising a ventilation opening that passes through the membrane, the ventilation opening extending parallel to the central axis.

7. The transducer according to claim 6, wherein the ventilation opening has an annular or polygonal shape.

8. The transducer according to claim 6, wherein the ventilation opening extends through the pillar.

9. The transducer according to claim 6, wherein the membrane has a first membrane surface and a second membrane surface, the first membrane surface facing the plurality of beams, the transducer further comprising a projection that extends from the second membrane surface and defines a sidewall of the ventilation opening.

10. The transducer according to claim 1, wherein the membrane comprises a reinforcement structure projecting monolithically.

11. The transducer according to claim 10, wherein the membrane has a first membrane surface and a second membrane surface, the first membrane surface facing the plurality of beams, and the reinforcement structure comprises a plurality of projections that extend from the second membrane surface of the membrane and has, in particular, a cobweb shape.

12. The transducer according to claim 1, wherein the membrane has a first membrane surface and a second membrane surface, the first membrane surface facing the plurality of beams, and the membrane comprises an arrest element that extend from the second membrane surface.

13. The transducer according to claim 1, wherein:
the body comprises a substrate and a sensitive region,
the substrate is traversed by a through cavity,
the membrane, the plurality of beams, and the pillar are formed in the sensitive region, and
the membrane is suspended over the through cavity.

14. The transducer according to claim 1, wherein the piezoelectric sensing elements are bimorphous.

15. An electronic device comprising:
a piezoelectric MEMS transducer that includes:
a body of semiconductor material having a central axis (S) and a peripheral area, the body including:
a plurality of beams extending transversely to the central axis and each having a first end and a second end, the first ends of the beams being coupled to the peripheral area of the body and the second ends facing the central axis;
a membrane extending transversely to the central axis and underneath the plurality of beams; and
a pillar extending parallel to the central axis and rigid with respect to the second ends of the beams and the membrane; and
a plurality of piezoelectric sensing elements arranged on the plurality of beams;
a signal-processing block coupled to the transducer;
a microprocessor, coupled to the signal-processing block;
a memory coupled to the microprocessor; and
an input/output unit, coupled to the microprocessor.

16. The electronic device according to claim 15, wherein the transducer includes a ventilation opening that passes through the membrane, the ventilation opening extending parallel to the central axis.

17. The electronic device according to claim 16, wherein the membrane has a first membrane surface and a second membrane surface, the first membrane surface facing the plurality of beams, and the transducer comprises a projection that extends from the second membrane surface and defines a sidewall of the ventilation opening.

18. A method for fabricating a MEMS transducer, comprising:

forming, in a body of semiconductor material, a membrane having a first and a second membrane surface;
forming a pillar of semiconductor material, projecting transversely to the first membrane surface;
forming a plurality of beams, extending in a direction transverse to the pillar and on the membrane, the beams each having a first end and a second end, the first ends of the beams being coupled to a peripheral area of the body and the second ends being fixed with respect to the pillar; and
forming a plurality of piezoelectric sensing elements on the plurality of beams.

19. The method according to claim 18, wherein forming the membrane comprises:
forming a first sacrificial layer of dielectric material on a substrate of semiconductor material;
forming first anchorage openings in the first sacrificial layer in the peripheral area of the body; and
forming a membrane layer of semiconductor material on the first sacrificial layer, the membrane layer filling the first anchorage openings and forming first anchorage elements.

20. The method according to claim 19, wherein forming the membrane comprises:
before forming the first anchorage openings, forming a plurality of reinforcement definition openings in the first sacrificial layer;
forming a second sacrificial layer on the first sacrificial layer, the second sacrificial layer extending within the plurality of reinforcement definition openings; and
depositing the membrane layer on the second sacrificial layer, to form the membrane and a reinforcement structure integral with respect to the membrane.

21. The method according to claim 19, wherein forming the pillar and the plurality of beams comprises:
after forming the membrane layer, forming a third sacrificial layer on the membrane layer;
forming second anchorage openings in the third sacrificial layer in the peripheral area of the body;
forming a pillar opening extending through the third sacrificial layer; and
forming a beam layer of semiconductor material on the third sacrificial layer, the beam layer filling the second anchorage openings and the pillar opening and forming the second anchorage elements and the pillar.

22. The method according to claim 18, further comprising forming a ventilation opening including selectively removing the membrane layer.

23. The method according to claim 22, wherein forming a ventilation opening further comprises selectively removing a portion of the pillar, thereby the ventilation opening passes through the membrane and the pillar.

24. The method according to claim 21, further comprising:
selectively removing a portion of the substrate underneath the first sacrificial layer so as to form a through cavity in the substrate, removing the first sacrificial layer; and
removing the second sacrificial layer to release the membrane, the beams, and the pillar.

25. The method according to claim 21, comprising, before forming the membrane, forming an arrest element monolithic with the membrane.

* * * * *